(12) United States Patent
Jiang et al.

(10) Patent No.: US 11,997,768 B2
(45) Date of Patent: May 28, 2024

(54) LED FILAMENT AND LED LIGHT BULB

(71) Applicant: ZHEJIANG SUPER LIGHTING ELECTRIC APPLIANCE CO., LTD, Zhejiang (CN)

(72) Inventors: Tao Jiang, Jiaxing (CN); Wei-Hong Xu, Jianxing (CN); Yukihiro Saito, Jiaxing (JP); Hayato Unagiike, Jiaxing (JP); Ai-Ming Xiong, Jiaxing (CN); Jun-Feng Xu, Jiaxing (CN); Yi-Ching Chen, Taichung (TW)

(73) Assignee: ZHEJIANG SUPER LIGHTING ELECTRIC APPLIANCE CO., LTD, Zhejiang (CN)

( * ) Notice: Subject to any disclaimer, the term of this patent is extended or adjusted under 35 U.S.C. 154(b) by 0 days.

(21) Appl. No.: 17/510,429

(22) Filed: Oct. 26, 2021

(65) Prior Publication Data

US 2022/0046769 A1 Feb. 10, 2022

Related U.S. Application Data

(63) Continuation-in-part of application No. 16/364,195, filed on Mar. 26, 2019, now Pat. No. 11,259,372,
(Continued)

(30) Foreign Application Priority Data

Sep. 28, 2014 (CN) .......................... 201410510593.6
Feb. 2, 2015 (CN) .......................... 201510053077.X
(Continued)

(51) Int. Cl.
*F21K 9/232* (2016.01)
*F21K 9/61* (2016.01)
(Continued)

(52) U.S. Cl.
CPC ............. *H05B 45/00* (2020.01); *F21K 9/232* (2016.08); *F21K 9/61* (2016.08); *F21V 3/08* (2018.02);
(Continued)

(58) Field of Classification Search
CPC ... F21K 9/232; F21K 9/61; F21V 3/12; F21V 3/08; F21V 15/04; H05B 45/00; F21Y 2115/10
See application file for complete search history.

(56) References Cited

U.S. PATENT DOCUMENTS 2,688,711 A 9/1954 Camillerapp
3,437,636 A 4/1969 Angelo
(Continued)

FOREIGN PATENT DOCUMENTS

CN 1901206 A 1/2007
CN 101208195 A 6/2008
(Continued)

*Primary Examiner* — Fatima N Farokhrooz
(74) *Attorney, Agent, or Firm* — Andrew M. Calderon; Calderon, Safran & Wright, P.C.

(57) ABSTRACT

An LED filament comprising a plurality of LED filament units, each of the plurality of LED filament units includes a LED chip with an upper surface and a lower surface opposite to the upper surface of the LED chip, and a light conversion layer comprising a top layer and a base layer, and the base layer comprises an upper surface and a lower surface opposite to the upper surface of the base layer, where the top layer with an upper surface and a lower surface opposite to the upper surface of the top layer is disposed on at least two sides of each of the LED chips, the lower surface of each of the LED chips is close to the upper surface of the base layer, and the upper surface of the top layer is away from each of the LED chips.

11 Claims, 16 Drawing Sheets

Related U.S. Application Data which is a continuation of application No. 16/234,124, filed on Dec. 27, 2018, now Pat. No. 10,845,008, which is a continuation-in-part of application No. 15/858,036, filed on Dec. 29, 2017, now Pat. No. 10,544,905, which is a continuation-in-part of application No. 29/627,379, filed on Nov. 27, 2017, now Pat. No. Des. 879,330, and a continuation-in-part of application No. 29/619,287, filed on Sep. 28, 2017, now Pat. No. Des. 862,740, and a continuation-in-part of application No. 15/723,297, filed on Oct. 3, 2017, now Pat. No. 10,655,792, which is a continuation-in-part of application No. 15/168,541, filed on May 31, 2016, now Pat. No. 9,995,474, and a continuation-in-part of application No. 15/308,995, filed as application No. PCT/CN2015/090815 on Sep. 25, 2015, now Pat. No. 10,781,979, said application No. 15/723,297 is a continuation-in-part of application No. 15/499,143, filed on Apr. 27, 2017, now Pat. No. 10,240,724, which is a continuation-in-part of application No. 15/384,311, filed on Dec. 19, 2016, now Pat. No. 10,487,987, which is a continuation-in-part of application No. 15/366,535, filed on Dec. 1, 2016, now Pat. No. 10,473,271, which is a continuation-in-part of application No. 15/237,983, filed on Aug. 16, 2016, now Pat. No. 10,228,093.

(30) Foreign Application Priority Data

| Date | | Number |
|---|---|---|
| Jun. 10, 2015 | (CN) | 201510316656.9 |
| Jun. 19, 2015 | (CN) | 201510347410.8 |
| Aug. 7, 2015 | (CN) | 201510489363.0 |
| Aug. 17, 2015 | (CN) | 201510502630.3 |
| Sep. 2, 2015 | (CN) | 201510555889.4 |
| Dec. 19, 2015 | (CN) | 201510966906.3 |
| Jan. 22, 2016 | (CN) | 201610041667.5 |
| Apr. 27, 2016 | (CN) | 201610272153.0 |
| Apr. 29, 2016 | (CN) | 201610281600.9 |
| Jun. 3, 2016 | (CN) | 201610394610.3 |
| Jul. 7, 2016 | (CN) | 201610544049.2 |
| Jul. 22, 2016 | (CN) | 201610586388.7 |
| Nov. 1, 2016 | (CN) | 201610936171.4 |
| Dec. 6, 2016 | (CN) | 201611108722.4 |
| Jan. 13, 2017 | (CN) | 201710024877.8 |
| Feb. 14, 2017 | (CN) | 201710079423.0 |
| Mar. 9, 2017 | (CN) | 201710138009.2 |
| Mar. 23, 2017 | (CN) | 201710180574.5 |
| Apr. 11, 2017 | (CN) | 201710234618.8 |
| May 8, 2017 | (CN) | 201710316641.1 |
| Sep. 18, 2017 | (CN) | 201710839083.7 |
| Sep. 21, 2017 | (CN) | 201730450712.8 |
| Sep. 22, 2017 | (CN) | 201730453237.X |
| Sep. 22, 2017 | (CN) | 201730453239.9 |
| Sep. 26, 2017 | (CN) | 201710883625.0 |
| Oct. 16, 2017 | (CN) | 201730489929.X |
| Oct. 27, 2017 | (CN) | 201730517887.6 |
| Oct. 30, 2017 | (CN) | 201730520672.X |
| Nov. 3, 2017 | (CN) | 201730537542.7 |
| Nov. 3, 2017 | (CN) | 201730537544.6 |
| Dec. 26, 2017 | (CN) | 201711434993.3 |
| Dec. 29, 2017 | (CN) | 201711477767.3 |
| Jan. 12, 2018 | (CN) | 201810031786.1 |
| Jan. 23, 2018 | (CN) | 201810065369.9 |
| Apr. 17, 2018 | (CN) | 201810343825.1 |
| Apr. 17, 2018 | (CN) | 201810344630.9 |
| May 23, 2018 | (CN) | 201810498980.0 |
| May 23, 2018 | (CN) | 201810501350.4 |
| Jun. 6, 2018 | (CN) | 201810573314.9 |
| Jul. 26, 2018 | (CN) | 201810836433.9 |
| Aug. 17, 2018 | (CN) | 201810943054.X |
| Aug. 30, 2018 | (CN) | 201811005145.5 |
| Aug. 30, 2018 | (CN) | 201811005536.7 |
| Sep. 17, 2018 | (CN) | 201811079889.1 |
| Oct. 30, 2018 | (CN) | 201811277980.4 |
| Oct. 31, 2018 | (CN) | 201811285657.1 |
| Nov. 19, 2018 | (CN) | 201811378173.1 |
| Nov. 19, 2018 | (CN) | 201811378189.2 |
| Dec. 18, 2018 | (CN) | 201811549205.X |

(51) Int. Cl.

| | |
|---|---|
| *F21V 3/08* | (2018.01) |
| *F21V 3/12* | (2018.01) |
| *F21V 15/04* | (2006.01) |
| *H05B 45/00* | (2022.01) |
| *F21Y 115/10* | (2016.01) |
| *H05B 45/3577* | (2020.01) |

(52) U.S. Cl.

CPC ............ *F21V 3/12* (2018.02); *F21V 15/04* (2013.01); *F21Y 2115/10* (2016.08); *H05B 45/3577* (2020.01)

(56) References Cited

U.S. PATENT DOCUMENTS

| | | |
|---|---|---|
| 4,271,288 A | 6/1981 | Woo et al. |
| 5,262,505 A | 11/1993 | Nakashima et al. |
| 5,859,181 A | 1/1999 | Zhao et al. |
| 5,942,592 A | 8/1999 | Zhao et al. |
| D422,099 S | 3/2000 | Kracke |
| 6,096,850 A | 8/2000 | Chiang et al. |
| 6,337,493 B1 | 1/2002 | Tanizawa et al. |
| 6,346,771 B1 | 2/2002 | Salam |
| 6,461,738 B2 | 10/2002 | Ishikawa et al. |
| 6,523,978 B1 | 2/2003 | Huang |
| 6,586,882 B1 | 7/2003 | Harbers |
| 7,041,766 B2 | 5/2006 | Yoneda et al. |
| D548,369 S | 8/2007 | Bembridge |
| D549,360 S | 8/2007 | An |
| D550,864 S | 9/2007 | Hernandez, Jr. et al. |
| 7,354,174 B1 | 4/2008 | Yan |
| 7,399,429 B2 | 7/2008 | Liu et al. |
| 7,432,313 B2 | 10/2008 | Yoneda et al. |
| 7,482,059 B2 | 1/2009 | Peng et al. |
| 7,484,860 B2 | 2/2009 | Demarest et al. |
| 7,618,162 B1 | 11/2009 | Parkyn et al. |
| 7,618,175 B1 | 11/2009 | Hulse |
| 7,667,225 B1 | 2/2010 | Lee et al. |
| 7,810,974 B2 | 10/2010 | van Rijswick et al. |
| D629,929 S | 12/2010 | Chen et al. |
| 8,025,816 B2 | 9/2011 | Murase et al. |
| 8,240,900 B2 | 8/2012 | Van Rijswick et al. |
| 8,400,051 B2 | 3/2013 | Hakata et al. |
| 8,455,895 B2 | 6/2013 | Chai et al. |
| 8,604,678 B2 | 12/2013 | Dai et al. |
| 8,858,027 B2 | 10/2014 | Takeuchi et al. |
| 8,915,623 B1 | 12/2014 | Claudet |
| 8,933,619 B1 | 1/2015 | Ou |
| 8,981,636 B2 | 3/2015 | Matsuda et al. |
| 9,016,900 B2 | 4/2015 | Takeuchi et al. |
| 9,097,396 B2 | 8/2015 | Rowlette, Jr. |
| 9,231,171 B2 | 1/2016 | Liu et al. |
| 9,234,635 B2 | 1/2016 | Kwisthout |
| 9,261,242 B2 | 2/2016 | Ge et al. |
| 9,285,086 B2 | 3/2016 | Genier et al. |
| 9,285,104 B2 | 3/2016 | Takeuchi et al. |
| 9,360,188 B2 | 6/2016 | Kircher et al. |
| 9,488,767 B2 | 11/2016 | Nava et al. |
| 9,732,930 B2 | 8/2017 | Takeuchi et al. |

(56) References Cited

U.S. PATENT DOCUMENTS

| | | |
|---|---|---|
| 9,761,765 B2 | 9/2017 | Basin et al. |
| 9,909,724 B2 | 3/2018 | Marinus et al. |
| 9,982,854 B2 | 5/2018 | Ma et al. |
| 10,066,791 B2 | 9/2018 | Zhang |
| 10,094,517 B2 | 10/2018 | Xiang |
| 10,094,523 B2 | 10/2018 | Andrews |
| 10,260,683 B2 | 4/2019 | Bergmann et al. |
| 10,218,129 B1 | 5/2019 | Lai et al. |
| 10,281,129 B1 | 5/2019 | Lai et al. |
| 10,323,799 B2 | 6/2019 | Huang |
| 10,330,297 B2 | 6/2019 | Kwisthout |
| 10,415,763 B2 | 9/2019 | Eckert |
| 10,436,391 B2 | 10/2019 | Hsiao et al. |
| 10,544,905 B2 | 1/2020 | Jiang et al. |
| 10,655,792 B2 | 5/2020 | Jiang |
| 10,663,117 B2 | 5/2020 | Chen et al. |
| 10,767,816 B1 | 9/2020 | Wu et al. |
| 10,784,428 B2 | 9/2020 | Jiang et al. |
| 10,794,545 B2 | 10/2020 | Jiang et al. |
| 10,868,226 B2 | 12/2020 | Jiang et al. |
| 10,969,063 B2 | 4/2021 | Schlereth et al. |
| 11,015,764 B2 | 5/2021 | Jiang et al. |
| 11,047,532 B1 | 6/2021 | Chen et al. |
| 11,143,363 B2 | 10/2021 | Feit |
| 11,187,387 B1 | 11/2021 | Yan et al. |
| 11,215,326 B2 | 1/2022 | Yan et al. |
| 11,231,147 B2 | 1/2022 | Cao et al. |
| 11,421,827 B2 | 8/2022 | Jiang et al. |
| 11,543,083 B2 | 1/2023 | Jiang et al. |
| 2003/0057444 A1 | 3/2003 | Niki et al. |
| 2003/0123150 A1* | 7/2003 | Brickey ............... G02B 5/0242 359/599 |
| 2004/0008525 A1 | 1/2004 | Shibata |
| 2004/0020424 A1 | 2/2004 | Sellin et al. |
| 2004/0072982 A1 | 4/2004 | Yoneda et al. |
| 2004/0100192 A1 | 5/2004 | Yano et al. |
| 2005/0001227 A1 | 1/2005 | Niki et al. |
| 2005/0107497 A1 | 5/2005 | Akaho et al. |
| 2005/0205881 A1 | 9/2005 | Yamazoe et al. |
| 2005/0224822 A1 | 10/2005 | Liu |
| 2005/0263778 A1 | 12/2005 | Hata et al. |
| 2006/0046327 A1 | 3/2006 | Shieh et al. |
| 2006/0163595 A1 | 7/2006 | Hsieh et al. |
| 2006/0226759 A1* | 10/2006 | Masuda .................... H01J 1/63 313/486 |
| 2007/0121319 A1 | 5/2007 | Wolf et al. |
| 2007/0225402 A1 | 9/2007 | Choi et al. |
| 2007/0267976 A1 | 11/2007 | Bohler et al. |
| 2008/0128730 A1 | 6/2008 | Fellows et al. |
| 2008/0137360 A1 | 6/2008 | Van Jijswick et al. |
| 2009/0057704 A1 | 3/2009 | Seo et al. |
| 2009/0059593 A1 | 3/2009 | Tsai |
| 2009/0122521 A1 | 5/2009 | Hsu |
| 2009/0152586 A1 | 6/2009 | Lee et al. |
| 2009/0184618 A1 | 7/2009 | Hakata et al. |
| 2009/0212698 A1 | 8/2009 | Bailey |
| 2009/0251882 A1 | 10/2009 | Ratcliffe |
| 2010/0012362 A1 | 1/2010 | Abe et al. |
| 2010/0025700 A1 | 2/2010 | Jung et al. |
| 2010/0032694 A1 | 2/2010 | Kim et al. |
| 2010/0047943 A1 | 2/2010 | Lee et al. |
| 2010/0053930 A1 | 3/2010 | Kim et al. |
| 2010/0135009 A1 | 6/2010 | Duncan et al. |
| 2010/0200885 A1 | 8/2010 | Hsu et al. |
| 2010/0265711 A1 | 10/2010 | Lee |
| 2011/0001148 A1 | 1/2011 | Sun et al. |
| 2011/0025205 A1 | 2/2011 | Van Rijswick et al. |
| 2011/0026242 A1 | 2/2011 | Ryu et al. |
| 2011/0031891 A1 | 2/2011 | Lee et al. |
| 2011/0037397 A1 | 2/2011 | Lee et al. |
| 2011/0043592 A1 | 2/2011 | Kinoshita et al. |
| 2011/0049472 A1 | 3/2011 | Kim et al. |
| 2011/0050073 A1 | 3/2011 | Huang |
| 2011/0156086 A1 | 6/2011 | Kim et al. |
| 2011/0210330 A1 | 9/2011 | Yang |
| 2011/0210358 A1 | 9/2011 | Kim et al. |
| 2011/0273863 A1 | 11/2011 | Cai et al. |
| 2011/0278605 A1 | 11/2011 | Agatani et al. |
| 2011/0303927 A1 | 12/2011 | Sanpei et al. |
| 2012/0119647 A1 | 5/2012 | Hsu |
| 2012/0145992 A1 | 6/2012 | Yoo et al. |
| 2012/0161193 A1 | 6/2012 | Hassan |
| 2012/0162965 A1 | 6/2012 | Takeuchi et al. |
| 2012/0169251 A1 | 7/2012 | Lai et al. |
| 2012/0175667 A1 | 7/2012 | Golle et al. |
| 2012/0182757 A1 | 7/2012 | Liang et al. |
| 2012/0256238 A1 | 10/2012 | Ning et al. |
| 2012/0256538 A1 | 10/2012 | Takeuchi et al. |
| 2012/0268936 A1 | 10/2012 | Pickard et al. |
| 2012/0273812 A1 | 11/2012 | Takahashi et al. |
| 2012/0281411 A1 | 11/2012 | Kajiya et al. |
| 2012/0293721 A1 | 11/2012 | Ueyama |
| 2012/0300432 A1 | 11/2012 | Matsubayashi et al. |
| 2013/0003346 A1 | 1/2013 | Letoquin et al. |
| 2013/0009179 A1 | 1/2013 | Bhat et al. |
| 2013/0058080 A1 | 3/2013 | Ge et al. |
| 2013/0058580 A1 | 3/2013 | Ge et al. |
| 2013/0077285 A1 | 3/2013 | Isogai et al. |
| 2013/0099271 A1 | 4/2013 | Hakata et al. |
| 2013/0100645 A1 | 4/2013 | Ooya et al. |
| 2013/0147348 A1* | 6/2013 | Motoya ............... H01L 25/0753 313/498 |
| 2013/0169174 A1 | 7/2013 | Lee et al. |
| 2013/0215625 A1 | 8/2013 | Takeuchi et al. |
| 2013/0235592 A1 | 9/2013 | Takeuchi et al. |
| 2013/0249381 A1 | 9/2013 | Takeuchi et al. |
| 2013/0264591 A1 | 10/2013 | Hussell |
| 2013/0264592 A1 | 10/2013 | Bergmann et al. |
| 2013/0265796 A1 | 10/2013 | Kwisthout |
| 2013/0271989 A1 | 10/2013 | Hussell et al. |
| 2013/0277705 A1 | 10/2013 | Seo et al. |
| 2013/0293098 A1 | 11/2013 | Li et al. |
| 2013/0301252 A1 | 11/2013 | Hussell et al. |
| 2013/0322072 A1 | 12/2013 | Pu et al. |
| 2014/0022788 A1 | 1/2014 | Dan et al. |
| 2014/0035123 A1 | 2/2014 | Seiji et al. |
| 2014/0049164 A1 | 2/2014 | McGuire et al. |
| 2014/0063829 A1* | 3/2014 | Kushalappa ............ F21S 45/49 362/508 |
| 2014/0071696 A1 | 3/2014 | Park et al. |
| 2014/0096901 A1 | 4/2014 | Hsieh et al. |
| 2014/0103376 A1 | 4/2014 | Ou et al. |
| 2014/0103794 A1 | 4/2014 | Ueda et al. |
| 2014/0141283 A1 | 5/2014 | Lee et al. |
| 2014/0152177 A1 | 6/2014 | Matsuda et al. |
| 2014/0175465 A1 | 6/2014 | Lee et al. |
| 2014/0185269 A1 | 7/2014 | Li |
| 2014/0197440 A1 | 7/2014 | Ye et al. |
| 2014/0217558 A1 | 8/2014 | Tamemoto |
| 2014/0218892 A1 | 8/2014 | Edwards et al. |
| 2014/0225514 A1 | 8/2014 | Pickard |
| 2014/0228914 A1 | 8/2014 | van de Ven et al. |
| 2014/0268779 A1 | 9/2014 | Sorensen et al. |
| 2014/0362565 A1 | 12/2014 | Yao et al. |
| 2014/0369036 A1 | 12/2014 | Feng |
| 2014/0375201 A1* | 12/2014 | Su ........................ F21V 29/83 313/35 |
| 2015/0003038 A1 | 1/2015 | Liu |
| 2015/0014732 A1 | 1/2015 | DeMille et al. |
| 2015/0022114 A1 | 1/2015 | Kim |
| 2015/0069442 A1* | 3/2015 | Liu ........................ F21K 9/232 257/98 |
| 2015/0070871 A1* | 3/2015 | Chen ...................... F21K 9/232 362/84 |
| 2015/0070887 A1* | 3/2015 | Yamauchi ............... F21K 9/232 362/231 |
| 2015/0085485 A1 | 3/2015 | Park |
| 2015/0085489 A1 | 3/2015 | Anderson |
| 2015/0097199 A1* | 4/2015 | Chen ...................... H01L 33/504 257/88 |
| 2015/0171287 A1 | 6/2015 | Matsumura et al. |
| 2015/0197689 A1 | 7/2015 | Tani et al. |
| 2015/0211723 A1 | 7/2015 | Athalye |
| 2015/0221822 A1 | 8/2015 | Kim et al. |

(56) References Cited

U.S. PATENT DOCUMENTS

| | | | |
|---|---|---|---|
| 2015/0255440 A1 | 9/2015 | Hsieh | |
| 2015/0312990 A1 | 10/2015 | van de Ven et al. | |
| 2015/0340347 A1 | 11/2015 | Jung et al. | |
| 2016/0056334 A1 | 2/2016 | Jang et al. | |
| 2016/0064628 A1 | 3/2016 | Fujii et al. | |
| 2016/0087003 A1 | 3/2016 | Lee et al. | |
| 2016/0116120 A1 | 4/2016 | Kwisthout | |
| 2016/0197243 A1 | 7/2016 | Lee et al. | |
| 2016/0238199 A1 | 8/2016 | Yeung et al. | |
| 2016/0348853 A1 | 12/2016 | Tanda et al. | |
| 2016/0369949 A1 | 12/2016 | Wu et al. | |
| 2016/0369952 A1* | 12/2016 | Weekamp | F21K 9/232 |
| 2016/0372647 A1 | 12/2016 | Seo et al. | |
| 2016/0377237 A1 | 12/2016 | Zhang | |
| 2017/0012177 A1* | 1/2017 | Trottier | F21K 9/00 |
| 2017/0016582 A1 | 1/2017 | Yang et al. | |
| 2017/0040504 A1 | 2/2017 | Chen et al. | |
| 2017/0051877 A1* | 2/2017 | Weijers | F21K 9/232 |
| 2017/0084809 A1 | 3/2017 | Jiang et al. | |
| 2017/0122498 A1 | 5/2017 | Zalka et al. | |
| 2017/0122499 A1 | 5/2017 | Lin et al. | |
| 2017/0138542 A1 | 5/2017 | Gielen et al. | |
| 2017/0138543 A1* | 5/2017 | Steele | F21V 23/02 |
| 2017/0167663 A1 | 6/2017 | Hsiao et al. | |
| 2017/0167711 A1 | 6/2017 | Kadijk | |
| 2017/0299125 A1 | 10/2017 | Takeuchi et al. | |
| 2017/0299126 A1 | 10/2017 | Takeuchi et al. | |
| 2017/0330868 A1 | 11/2017 | Pu et al. | |
| 2018/0045380 A1 | 2/2018 | Li et al. | |
| 2018/0080611 A1 | 3/2018 | Haberkorn et al. | |
| 2018/0080612 A1 | 3/2018 | Haberkorn et al. | |
| 2018/0106435 A1 | 4/2018 | Wu et al. | |
| 2018/0119892 A1 | 5/2018 | Jiang et al. | |
| 2018/0172218 A1 | 6/2018 | Feit | |
| 2018/0230374 A1 | 8/2018 | Ito et al. | |
| 2019/0032858 A1 | 1/2019 | Cao et al. | |
| 2019/0049073 A1 | 2/2019 | Eckert | |
| 2019/0137047 A1 | 5/2019 | Hu | |
| 2019/0139943 A1 | 5/2019 | Tiwari et al. | |
| 2019/0186697 A1 | 6/2019 | Jiang et al. | |
| 2019/0195434 A1 | 6/2019 | Jiang et al. | |
| 2019/0219231 A1 | 7/2019 | Jiang et al. | |
| 2019/0219232 A1 | 7/2019 | Takeuchi et al. | |
| 2019/0242532 A1 | 8/2019 | Jiang et al. | |
| 2019/0264874 A1 | 8/2019 | Jiang et al. | |
| 2019/0264875 A1 | 8/2019 | Jiang et al. | |
| 2019/0264876 A1 | 8/2019 | Jiang et al. | |
| 2019/0271443 A1 | 9/2019 | Jiang et al. | |
| 2019/0277483 A1 | 9/2019 | Kwisthout | |
| 2019/0277484 A1 | 9/2019 | Kwisthout | |
| 2019/0301683 A1 | 10/2019 | Jiang et al. | |
| 2019/0301684 A1 | 10/2019 | Jiang et al. | |
| 2019/0309907 A1 | 10/2019 | Jiang et al. | |
| 2019/0315921 A1 | 10/2019 | Saito et al. | |
| 2019/0368666 A1 | 12/2019 | Jiang et al. | |
| 2019/0368667 A1 | 12/2019 | On et al. | |
| 2020/0035876 A1 | 1/2020 | Jiang et al. | |
| 2020/0049315 A1 | 2/2020 | Wu et al. | |
| 2020/0144230 A1 | 5/2020 | Lin et al. | |
| 2020/0161522 A1 | 5/2020 | Jiang et al. | |
| 2020/0176646 A1 | 6/2020 | Li | |
| 2021/0148533 A1 | 5/2021 | Van Bommel et al. | |
| 2021/0381657 A1 | 12/2021 | Xiong et al. | |

FOREIGN PATENT DOCUMENTS

| | | |
|---|---|---|
| CN | 201163628 Y | 12/2008 |
| CN | 101360801 A | 2/2009 |
| CN | 201448620 U | 5/2010 |
| CN | 101826588 A | 9/2010 |
| CN | 101914357 A | 12/2010 |
| CN | 102121576 A | 7/2011 |
| CN | 102209625 A | 10/2011 |
| CN | 202209551 U | 5/2012 |
| CN | 202252991 U | 5/2012 |
| CN | 202253168 U | 5/2012 |
| CN | 202473919 U | 10/2012 |
| CN | 202719450 U | 2/2013 |
| CN | 101968181 B | 3/2013 |
| CN | 102958984 A | 3/2013 |
| CN | 102969320 A | 3/2013 |
| CN | 102980054 A | 3/2013 |
| CN | 202834823 U | 3/2013 |
| CN | 103123949 A | 5/2013 |
| CN | 203131524 U | 8/2013 |
| CN | 103335226 A | 10/2013 |
| CN | 203367275 U | 12/2013 |
| CN | 103542308 A | 1/2014 |
| CN | 103560128 A | 2/2014 |
| CN | 103682042 A | 3/2014 |
| CN | 203477967 U | 3/2014 |
| CN | 103872224 A | 6/2014 |
| CN | 103890481 A | 6/2014 |
| CN | 203628311 U | 6/2014 |
| CN | 203628391 U | 6/2014 |
| CN | 203628400 U | 6/2014 |
| CN | 203656627 U | 6/2014 |
| CN | 203671312 U | 6/2014 |
| CN | 103939758 A | 7/2014 |
| CN | 103956421 A | 7/2014 |
| CN | 103972364 A | 8/2014 |
| CN | 103994349 A | 8/2014 |
| CN | 203771136 U | 8/2014 |
| CN | 203857313 U | 10/2014 |
| CN | 203880468 U | 10/2014 |
| CN | 203907265 U | 10/2014 |
| CN | 203910792 U | 10/2014 |
| CN | 203932049 U | 11/2014 |
| CN | 203940268 U | 11/2014 |
| CN | 104231994 A | 12/2014 |
| CN | 204062539 U | 12/2014 |
| CN | 104295945 A | 1/2015 |
| CN | 104319345 A | 1/2015 |
| CN | 204083941 U | 1/2015 |
| CN | 204088366 U | 1/2015 |
| CN | 204153513 U | 2/2015 |
| CN | 104456165 A | 3/2015 |
| CN | 104600174 A | 5/2015 |
| CN | 104600181 A | 5/2015 |
| CN | 204328550 U | 5/2015 |
| CN | 104716247 A | 6/2015 |
| CN | 204387765 U | 6/2015 |
| CN | 204459844 U | 7/2015 |
| CN | 204494343 U | 7/2015 |
| CN | 104913217 A | 9/2015 |
| CN | 104979455 A | 10/2015 |
| CN | 105042354 A | 11/2015 |
| CN | 105090789 A | 11/2015 |
| CN | 105098032 A | 11/2015 |
| CN | 105140381 A | 12/2015 |
| CN | 105161608 A | 12/2015 |
| CN | 105226167 A | 1/2016 |
| CN | 204986570 U | 1/2016 |
| CN | 105295792 A | 2/2016 |
| CN | 105371243 A | 3/2016 |
| CN | 205081145 U | 3/2016 |
| CN | 105542693 A | 5/2016 |
| CN | 105609621 A | 5/2016 |
| CN | 205264758 U | 5/2016 |
| CN | 205350910 U | 6/2016 |
| CN | 105789195 A | 7/2016 |
| CN | 106060630 A | 10/2016 |
| CN | 106468405 A | 3/2017 |
| CN | 106898681 A | 6/2017 |
| CN | 106939973 A | 7/2017 |
| CN | 107035979 A | 8/2017 |
| CN | 107123641 A | 9/2017 |
| CN | 107170733 A | 9/2017 |
| CN | 107204342 A | 9/2017 |
| CN | 206563190 U | 10/2017 |
| CN | 107314258 A | 11/2017 |
| CN | 206973307 U | 2/2018 |
| CN | 207034659 U | 2/2018 |
| CN | 108039402 A | 5/2018 |

(56) References Cited

FOREIGN PATENT DOCUMENTS

| | | | |
|---|---|---|---|
| CN | 207849021 U | | 9/2018 |
| CN | 109155306 A | | 1/2019 |
| CN | 209354987 U | | 9/2019 |
| CN | 111550687 A | | 8/2020 |
| EP | 2535640 A1 | | 12/2012 |
| EP | 2631958 A1 | | 8/2013 |
| EP | 2760057 A1 | | 7/2014 |
| EP | 2567145 B1 | | 4/2016 |
| GB | 2547085 A | | 8/2017 |
| JP | 3075689 U | | 2/2001 |
| JP | 2001126510 A | | 5/2001 |
| JP | 2003037239 A | | 2/2003 |
| JP | 2006202500 A | | 8/2006 |
| JP | 2012099726 A | * | 5/2012 |
| JP | 2012099726 A | | 5/2012 |
| JP | 2013021346 A | | 1/2013 |
| JP | 2013225587 A | | 10/2013 |
| JP | 2014032981 A | | 2/2014 |
| JP | 2014143156 A | * | 8/2014 |
| KR | 20140132517 A | | 11/2014 |
| TW | 201224360 A | * | 6/2012 ............. H01L 23/36 |
| WO | 2012053134 A1 | | 4/2012 |
| WO | 2014012346 A1 | | 1/2014 |
| WO | 2014167458 A1 | | 10/2014 |
| WO | 2017037010 A1 | | 3/2017 |
| WO | 2017085063 A1 | | 5/2017 |
| WO | 2017186150 A1 | | 11/2017 |

* cited by examiner

LED FILAMENT AND LED LIGHT BULB

CROSS-REFERENCE TO RELATED APPLICATIONS

This application is a continuation-in-part of U.S. application Ser. No. 16/364,195 filed on 2019 Mar. 26, which is a continuation application of U.S. application Ser. No. 16/234,124 filed on 2018 Dec. 27, which claims priority to Chinese Patent Applications No. 201510502630.3 filed on 2015 Aug. 17; No. 201510966906.3 filed on 2015 Dec. 19; No. 201610041667.5 filed on 2016 Jan. 22; No. 201610272153.0 filed on 2016 Apr. 27; No. 201610394610.3 filed on 2016 Jun. 3; No. 201610586388.7 filed on 2016 Jul. 22; No. 201610544049.2 filed on 2016 Jul. 7; No. 201610936171.4 filed on 2016 Nov. 1; No. 201611108722.4 filed on 2016 Dec. 6; No. 201610281600.9 filed on 2016 Apr. 29; No. 201710024877.8 filed on 2017 Jan. 13; No. 201710079423.0 filed on 2017 Feb. 14; No. 201710138009.2 filed on 2017 Mar. 9; No. 201710180574.5 filed on 2017 Mar. 23; No. 201710234618.8 filed on 2017 Apr. 11; No. 201410510593.6 filed on 2014 Sep. 28; No. 201510053077.X filed on 2015 Feb. 2; No. 201510316656.9 filed on 2015 Jun. 10; No. 201510347410.8 filed on 2015 Jun. 19; No. 201510489363.0 filed on 2015 Aug. 7; No. 201510555889.4 filed on 2015 Sep. 2; No. 201710316641.1 filed on 2017 May 8; No. 201710839083.7 filed on 2017 Sep. 18; No. 201710883625.0 filed on 2017 Sep. 26; No. 201730450712.8 filed on 2017 Sep. 21; No. 201730453239.9 filed on 2017 Sep. 22; No. 201730453237.X filed on 2017 Sep. 22; No. 201730537542.7 filed on 2017 Nov. 3; No. 201730537544.6 filed on 2017 Nov. 3; No. 201730520672.X filed on 2017 Oct. 30; No. 201730517887.6 filed on 2017 Oct. 27; No. 201730489929.X filed on 2017 Oct. 16; No. 201711434993.3 filed on 2017 Dec. 26; No. 201711477767.3 filed on 2017 Dec. 29; No. 201810031786.1 filed on 2018 Jan. 12; No. 201810065369.9 filed on 2018 Jan. 23; No. 201810343825.1 filed on 2018 Apr. 17; No. 201810344630.9 filed on 2018 Apr. 17; No. 201810501350.4 filed on 2018 May 23; No. 201810498980.0 filed on 2018 May 23; No. 201810573314.9 filed on 2018 Jun. 6; No. 201810836433.9 filed on 2018 Jul. 26; No. 201810943054.X filed on 2018 Aug. 17; No. 201811005536.7 filed on 2018 Aug. 30; No. 201811005145.5 filed on 2018 Aug. 30; No. 201811079889.1 filed on 2018 Sep. 17; No. 201811277980.4 filed on 2018 Oct. 30; No. 201811285657.1 filed on 2018 Oct. 31; No. 201811378173.1 filed on 2018 Nov. 19; No. 201811378189.2 filed on 2018 Nov. 19; No. 201811549205.X filed on 2018 Dec. 18, each of which is hereby incorporated by reference in its entirety.

TECHNICAL FIELD

The present disclosure relates to a lighting field, and more particularly to an LED filament and its application in an LED light bulb.

RELATED ART

Incandescent bulbs have been widely used for homes or commercial lighting for decades. However, incandescent bulbs are generally with lower efficiency in terms of energy application, and about 90% of energy input can be converted into a heat form to dissipate. In addition, because the incandescent bulb has a very limited lifespan (about 1,000 hours), it needs to be frequently replaced. These traditional incandescent bulbs are gradually replaced by other more efficient lighting devices, such as fluorescent lights, high-intensity discharge lamps, light-emitting diodes (LEDs) lights and the like. In these electric lamps, the LED light lamp attracts widespread attention in its lighting technology. The LED light lamp has the advantages of long lifespan, small in size, environmental protection and the like, therefore the application of the LED light lamp continuously grows.

In recent years, LED light bulbs with LED filaments have been provided on the market. At present, LED light bulbs using LED filaments as illumination sources still have the following problems to be improved.

Firstly, an LED hard filament is provided with a substrate (for example, a glass substrate) and a plurality of LED chips disposed on the substrate. However, the illumination appearance of the LED light bulbs relies on multiple combinations of the LED hard filaments to produce the better illumination appearances. The illumination appearance of the single LED hard filament cannot meet the general needs in the market. A traditional incandescent light bulb is provided with a tungsten filament, the uniform light emitting can be generated due to the natural bendable property of the tungsten filament. In contrast, the LED hard filament is difficult to achieve such uniform illumination appearances. There are many reasons why LED hard filaments are difficult to achieve the uniform illumination appearance. In addition to the aforementioned lower bendable property, one of the reasons is that the substrate blocks the light emitted by the LED chip, and furthermore the light generated by the LED chip is displayed similar to a point light source which causes the light showing concentrated illumination and with poor illumination uniformity. In other words, a uniform distribution of the light emitted from LED chip produces a uniform illumination appearance of the LED filament. On the other hand, the light ray distribution similar to a point light source may result in uneven and concentrated illumination.

Secondly, there is one kind of LED soft filament, which is similar to the structure of the above-mentioned LED hard filament and is employed a flexible printed circuit substrate (hereinafter referred to FPC) instead of the glass substrate to enable the LED filament having a certain degree of bending. However, by utilizing the LED soft filament made of the FPC, the FPC has a thermal expansion coefficient different from that of the silicon gel coated covering the LED soft filament, and the long-term use causes the displacement or even degumming of the LED chips. Moreover, the FPC may not beneficial to flexible adjustment of the process conditions and the like. Besides, during bending the LED soft filament it has a challenge in the stability of the metal wire bonded between LED chips. When the arrangement of the LED chips in the LED soft filament is dense, if the adjacent LED chips are connected by means of metal wire bonding, it is easy to cause the stress to be concentrated on a specific part of the LED soft filament when the LED soft filament is bent, thereby the metal wire bonding between the LED chips are damaged and even broken.

In addition, the LED filament is generally disposed inside the LED light bulb, and in order to present the aesthetic appearance and also to make the illumination of the LED filament more uniform and widespread, the LED filament is bent to exhibit a plurality of curves. Since the LED chips are arranged in the LED filaments, and the LED chips are relatively hard objects, it is difficult for the LED filaments to be bent into a desired shape. Moreover, the LED filament is also prone to cracks due to stress concentration during bending.

In order to increase the aesthetic appearance and make the illumination appearance more uniform, an LED light bulb has a plurality of LED filaments, which are disposed with different placement or angles. However, since the plurality of LED filaments need to be installed in a single LED light bulb, and these LED filaments need to be fixed individually, the assembly process will be more complicated and the production cost will be increased.

In addition, since the driving requirements for lighting the LED filament are substantially different from for lighting the conventional tungsten filament lamp. Therefore, for LED light bulbs, how to design a power supply circuitry with a stable current to reduce the ripple phenomenon of the LED filament in an acceptable level so that the user does not feel the flicker is one of the design considerations. Besides, under the space constraints and the premises of achieving the required light efficiency and the driving requirements, how to design a power supply circuitry with the structure simply enough to embed into the space of the lamp head is also a focus of attention.

Patent No. CN202252991U discloses the light lamp employing with a flexible PCB board instead of the aluminum heat dissipation component to improve heat dissipation. Wherein, the phosphor is coated on the upper and lower sides of the LED chip or on the periphery thereof, and the LED chip is fixed on the flexible PCB board and sealed by an insulating adhesive. The insulating adhesive is epoxy resin, and the electrodes of the LED chip are connected to the circuitry on the flexible PCB board by gold wires. The flexible PCB board is transparent or translucent, and the flexible PCB board is made by printing the circuitry on a polyimide or polyester film substrate. Patent No. CN105161608A discloses an LED filament light-emitting strip and a preparation method thereof. Wherein the LED chips are disposed without overlapped, and the light-emitting surfaces of the LED chips are correspondingly arranged, so that the light emitting uniformity and heat dissipation is improved accordingly. Patent No. CN103939758A discloses that a transparent and thermally conductive heat dissipation layer is formed between the interface of the carrier and the LED chip for heat exchange with the LED chip. According to the aforementioned patents, which respectively use a PCB board, adjust the chips arrangement or form a heat dissipation layer, the heat dissipation of the filament of the lamp can be improved to a certain extent correspondingly; however, the heat is easy to accumulate due to the low efficiency in heat dissipation. The last one, Publication No. CN204289439U discloses an LED filament with omni-directional light comprising a substrate mixed with phosphors, at least one electrode disposed on the substrate, at least one LED chip mounted on the substrate, and the encapsulant coated on the LED chip. The substrate formed by the silicone resin contained with phosphors eliminates the cost of glass or sapphire as a substrate, and the LED filament equipping with this kind of substrate avoids the influence of glass or sapphire on the light emitting of the LED chip. The 360-degree light emitting is realized, and the illumination uniformity and the light efficiency are greatly improved. However, due to the fact that the substrate is formed by silicon resin, the defect of poor heat resistance is a disadvantage.

SUMMARY

It is noted that the present disclosure includes one or more inventive solutions currently claimed or not claimed, and in order to avoid confusion between the illustration of these embodiments in the specification, a number of possible inventive aspects herein may be collectively referred to "present/the invention."

A number of embodiments are described herein with respect to "the invention." However, the word "the invention" is used merely to describe certain embodiments disclosed in this specification, whether or not in the claims, is not a complete description of all possible embodiments. Some embodiments of various features or aspects described below as "the invention" may be combined in various ways to form an LED light bulb or a portion thereof.

It is an object of the claimed invention to provide an LED filament, the LED filament comprises a plurality of LED filament units, each of the plurality of LED filament units includes a LED chip with an upper surface and a lower surface opposite to the upper surface of the LED chip, and a light conversion layer comprising a top layer and a base layer, and the base layer comprises an upper surface and a lower surface opposite to the upper surface of the base layer, where the top layer with an upper surface and a lower surface opposite to the upper surface of the top layer is disposed on at least two sides of each of the LED chips, the lower surface of the LED chips is close to the upper surface of the base layer, and the upper surface of the top layer is away from the LED chips;

H represents the distance from the upper surface of each of the LED chips to the upper surface of the top layer, and H is between a and $10C/2 \tan 0.5\alpha$, a represents the maximum value in both $0.5C/2 \tan 0.5\alpha$ and $W1/2 \tan 0.5\beta$, C represents the length of each of the LED filament units in the longitudinal direction of the LED filament, $\alpha$ represents the illumination angle of each of the LED chips in the longitudinal direction of the LED filament, W1 represents the width of the upper surface of the base layer or the width of the lower surface of the top layer in the short axial direction of the LED filament; and $\beta$ represents the illumination angle of each of the LED chips in the short axial direction of the LED filament.

In accordance with an embodiment with the present invention, H is between A and $2C/2 \tan 0.5\alpha$, A represents the maximum value in both $C/2 \tan 0.5\alpha$ and $W1/2 \tan 0.5\beta$.

In accordance with an embodiment of the present invention, H is between b and 2.9 C, b represents the maximum of 0.14C and 0.28W1.

In accordance with an embodiment of the present invention, H is between B and 0.58C, B represents the maximum of 0.28C and 0.28W1.

In accordance with an embodiment of the present invention, a distance between a center of the upper surface of the LED chip and the upper surface of the top layer in the width direction of the LED filament is equal to a distance between the center of the upper surface of the LED chip and the upper surface of the top layer in the height direction of the LED filament.

To make the above and other objects, features, and advantages of the present invention clearer and easier to understand, the following embodiments will be described in detail with reference to the accompanying drawings.

BRIEF DESCRIPTION OF THE DRAWINGS

The present invention will become more readily apparent to those ordinarily skilled in the art after reviewing the following detailed description and accompanying drawings, in which.

DETAILED DESCRIPTION

Figure 1:
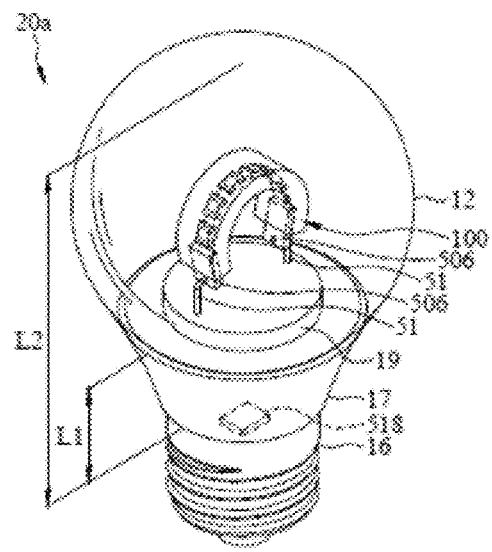
FIG. 1 is perspective views of the LED light bulb in accordance with an embodiment of the present invention.

The present disclosure provides a novel LED filament and its application the LED light bulb. The present disclosure will now be described in the following embodiments with reference to the drawings. The following descriptions of various implementations are presented herein for purpose of illustration and giving examples only. This invention is not intended to be exhaustive or to be limited to the precise form disclosed. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of components may be exaggerated for clarity. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that, although the terms first, second, third etc. may be used herein to describe various elements, components, regions, layers, or steps, these elements, components, regions, layers, and/or steps should not be limited by these terms. Unless the context indicates otherwise, these terms are only used to distinguish one element, component, region, layer, or step from another element, component, region, or step, for example as a naming convention. Thus, a first element, component, region, layer, or step discussed below in one section of the specification could be termed a second element, component, region, layer, or step in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled," or "immediately connected" or "immediately coupled" to another element, there are no intervening elements present. Other words used to describe the relationship between elements should be interpreted in a like fashion (e.g., "between" versus "directly between," "adjacent" versus "directly adjacent," etc.). However, the term "contact," as used herein refers to a direct connection (i.e., touching) unless the context indicates otherwise.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "equal," "planar," or "coplanar," as used herein when referring to orientation, layout, location, position, shapes, sizes, amounts, or other measures do not necessarily mean an exactly identical orientation, layout, location, position, shape, size, amount, or other measure, but are intended to encompass nearly identical orientation, layout, location, position, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Terms such as "about" or "approximately" may reflect sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

Referring to FIG. 1, FIG. 1 are schematic structural diagrams showing the structure of a first embodiment and a second embodiment of the present invention. As shown in the figures, the LED light bulbs 1*a*, 1*b* include a lamp housing 12, a lamp cap 16 connected with the lamp housing 12, at least two conductive brackets (also referring to conductive supports) 51*a*, 51*b* disposed in the lamp housing 12, a driving circuit 518 disposed in the lamp cap 16 and electrically connected to the conductive brackets 51*a*. 51*b* and the lamp cap 16, and a single strip light emitting part 100 disposed in the lamp housing 12, the embodiment of the light emitting part 100 may be an LED filament including an LED chip.

The conductive brackets 51*a* and 51*b* are used for electrically connecting with the two conductive electrodes 506 of the LED filament 100, and can also be used for supporting the weight of the LED filament 100. The driving circuit 518 is electrically connected to the conductive brackets 51*a*, 51*b* and the lamp cap 16. The lamp cap 16 is configured to connect to the lamp socket of the conventional light bulb. The lamp socket is used to transmit the electricity to the lamp cap 16. The driving circuit 518 is used to drive the light emitting part 100 emitting the light ray after the driving circuit 518 obtains the electricity from the lamp cap 16. The LED light bulbs 1*a* and 1*b* can generate omni-directional light because of the light emitting part 100 of the LED light bulbs 1*a* and 1*b* has symmetrical characteristics in terms of structure, shape, contour, curve, or the like, or the symmetrical characteristics of the light emitting direction of the light emitting part 100 (that is, the light emitting surface of the LED filament of the present invention, the details as described later). In the present embodiment, the driving circuit 518 is disposed within the LED light bulb. However, in some embodiments, the drive circuit 518 is disposed outside of the LED light bulb.

In the embodiment as shown in the FIG. 1, the conductive brackets 51*a*, 51*b* of the LED light bulb 1*a* are exemplified by two, but not limited thereto, and the number of the conductive brackets can be increased by the requirements of conducting or supporting of the light emitting part 100.

The LED chip units 102, 104, or named with the LED section 102, 104, may be composed of a single LED chip, or two LED chips. Of course, it may also include multiple LED chips, that is, equal to or greater than three LED chips.

Figure 2A:
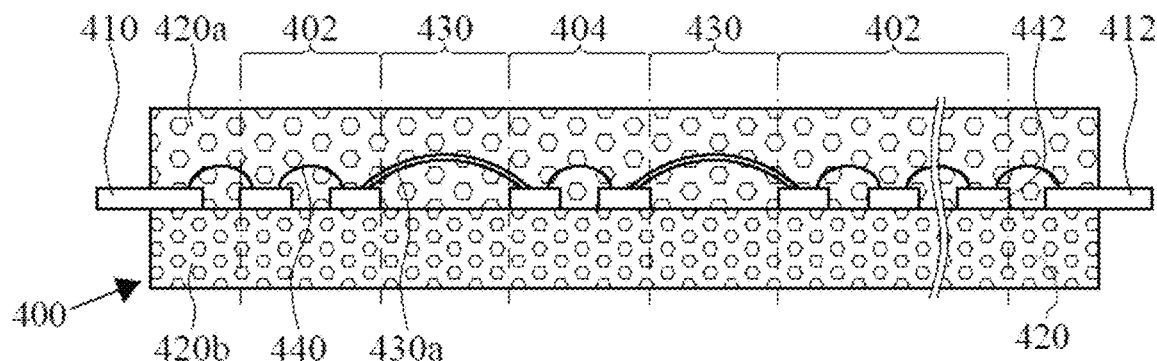
FIG. 2A is a cross sectional view of an LED filament in accordance with an embodiment of the present invention.

Referring to FIGS. 2A to 2F, FIG. 2A is a schematic structural view of another embodiment of an LED filament of the present invention. As shown in FIG. 2A, the LED filament 400 has a light conversion layer 420, LED sections 402, 404, conductive electrodes 410, 412, and a conductive section 430 for electrically connecting adjacent two LED sections 402, 404. Each of the LED sections 402, 404 includes at least two LED chips 442 that are electrically connected to each other by the wires 440. In the present embodiment, the conductive section 430 includes at least one conductor 430*a* that connects the adjacent LED sections 402, 404, wherein the shortest distance between the two LED chips 442 respectively located in the two adjacent LED sections 402, 404 is greater than the distance between two adjacent LED chips 442 within the one LED section 402/404. Therefore, it is ensured that when the two LED sections 402, 404 are bent, the conductive section 430 is not easily broken due to the stress of bending. The length of the wire 440 is less than the length of the conductor 430*a*. The light conversion layer 420 is coated on at least two sides of the LED chip 442 and conductive electrodes 410, 412, and a portion of each of the conductive electrodes 410, 412 is not coated with the light conversion layer 420. The light conversion layer 420 may have at least one top layer 420*a* (or upper layer) and one base layer 420*b* (or lower layer). In the present embodiment, the top layer 420*a* and the base layer 420*b* are disposed on the opposing surface of the LED chip 442 and conductive electrodes 410, 412, and a portion of each of the conductive electrodes 410, 412 is excluded. It should be particularly noted that the thickness, diameter or width of the top layer 420*a* in the LED sections 402, 404 or the conductive section 430 described pertaining to FIGS.

2A-2G refers to the radial direction of the LED filament. The thickness of the top layer 420a is the distance between its outer surface to the interface of the top layer 420a and the base layer 420b, or the distance from its outer surface and the interface of the LED chip 442 or the conductor 430a and the base layer 420b, wherein the outer surface of the top layer 420a is a surface away from the base layer.

In the present embodiment, the top layer 420a and the base layer 420b may be composed of different particles or particle densities according to the requirements or designed structures. For example, in the case where the main emitting surface of the LED chip 442 is toward to the top layer 420a but not the base layer 420b, the base layer 420b may be composed of light scattering particles to increase the light dispersion. Thereby the brightness of the base layer 420b can be maximized, or even the brightness that can be produced close to the top layer 420a. In addition, the base layer 420b may also be composed of phosphor particles with high density to increase the hardness of the base layer 420b. In the manufacturing process of the LED filament 400, the base layer 420b may be prepared first, and then the LED chip 442, the wire 440 and the conductor 430a are disposed on the base layer 420b. Since the base layer 420b has a hardness that can support the subsequent manufacturing process of the LED chips and the wires, therefore the yield and the firmness of the LED chips 442, the wires 440, and the conductors 430a disposed on the base layer 420b can be improved and resulted in less or even no sink or skew. Finally, the top layer 420a is overlaid on the base layer 420b, the LED chip 442, the wires 440, and the conductor 430a.

Figure 2B:
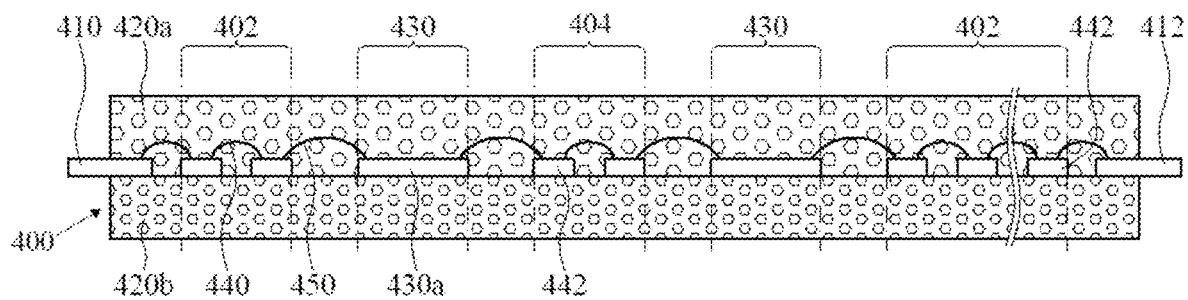
FIGS. 2B to 2F are cross sectional views of various LED filaments in accordance with the present invention.

As shown in FIG. 2B, in the present embodiment, the conductive section 430 is also located between the two adjacent LED sections 402, 404, and the plurality of LED chips 442 in the LED sections 402, 404 are electrically connected to each other through the wires 440. However, the conductor 430a in the conductive section 430 in FIG. 2B is not in the form of a wire but in a sheet or film form. In some embodiments, the conductor 430a can be a copper foil, a gold foil, or other materials that can conduct electrical conduction. In the present embodiment, the conductor 430a is attached to the surface of the base layer 420b and contact with the top layer 420a, that is, located between the base layer 420b and the top layer 420a. Moreover, the conductive section 430 and the LED sections 402, 404 are electrically connected by wires 450, that is, the two closest LED chips 442 respectively located in the adjacent two LED sections 402, 404 are electrically connected by the wires 450 and the conductors 430a of the conductive section 430. Wherein, the length of the conductive section 430 is greater than the distance between two adjacent LED chips of one LED sections 402, 404, and the length of the wire 440 in the LED sections 402, 404 is less than the length of the conductor 430a. This design ensures that the conductive section 430 has good bendability. Assuming that the maximum thickness of the LED chip in the radial direction of the filament is H, the thickness of the conductive electrode and the conductor 430a in the radial direction of the filament is around 0.5H to 1.4H, preferably around 0.5H to 0.7H. This ensures the wire bonding process can be carried out while ensures the quality of the LED filament and the precision of the wire bonding process, thereby the LED filament has good strength and the stability of the product is improved.

Figure 2C:
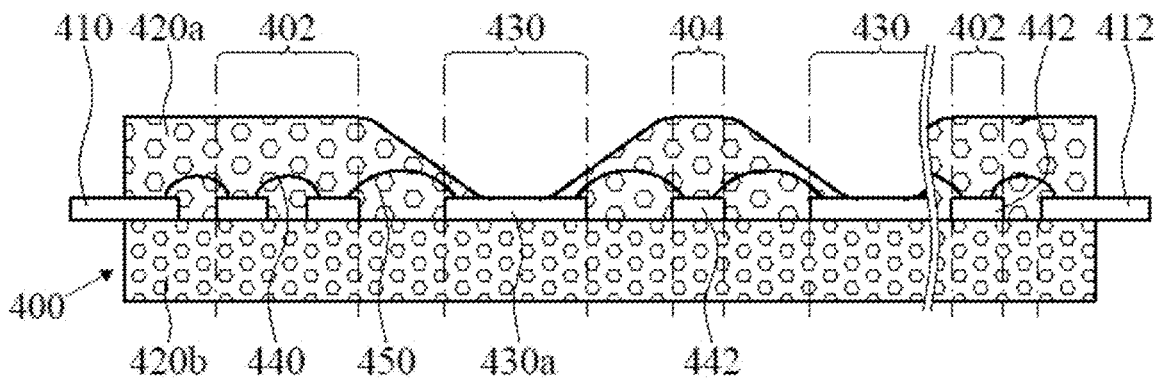

As shown in FIG. 2C, in the present embodiment, the top layer 420a of the LED sections 402, 404 has the largest diameter (or maximum thickness) in the radial direction of the LED filament and the diameter of the top layer 420a is gradually reduced from the LED sections 402, 404 to the conductive section 430, and a portion of the conductor 430a (for example, the intermediate portion) is not covered by the top layer 420a. The base layer 420b, whether in the LED sections 402, 404 or in the conductive section 430, has substantially the same width, thickness or diameter in the radial direction of the LED filament. In the present embodiment, the number of LED chips 442 in each of the LED sections 402, 404 may be different. For example, some LED sections 402, 404 have only one LED chip 442, and some LED sections 402, 404 have two or more LED chips 442. In addition to the number of the LED chip 442 designing in each LED section 402, 402 is different, the types of the LED chip 442 may also be different. It is acceptable as well that the number of the LED chip 442 designing in each LED section 402, 402 is consistent, and the types of the LED chip 442 is different.

Figure 2D:
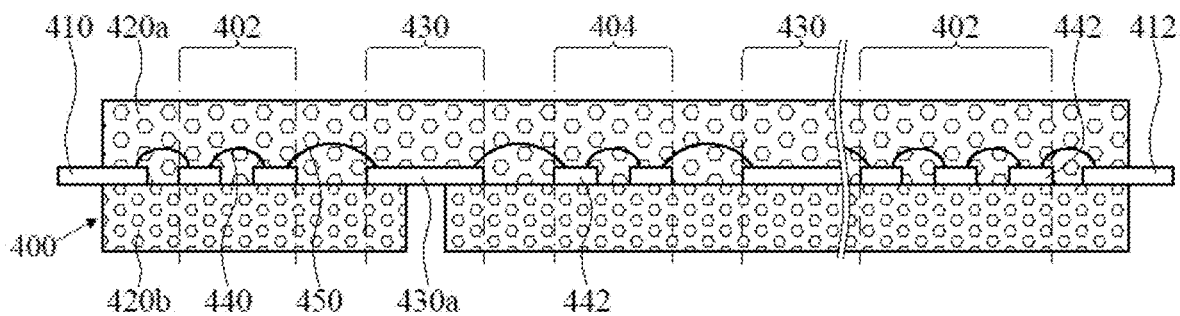

As shown in FIG. 2D, in the present embodiment, the top layer 420a is substantially uniform in width, thickness or diameter in the radial direction of the LED filament, whether in the LED sections 402, 404 or in the conductive section 430. A portion of the base layer 420b has been recessed or hollowed out corresponding to a portion of at least one conductor 430a, for example, the intermediate portion of the at least one conductor 430a is not covered by the base layer 420b, and at least one of the other conductors 430a is completely covered by the base layer 420b.

Figure 2E:
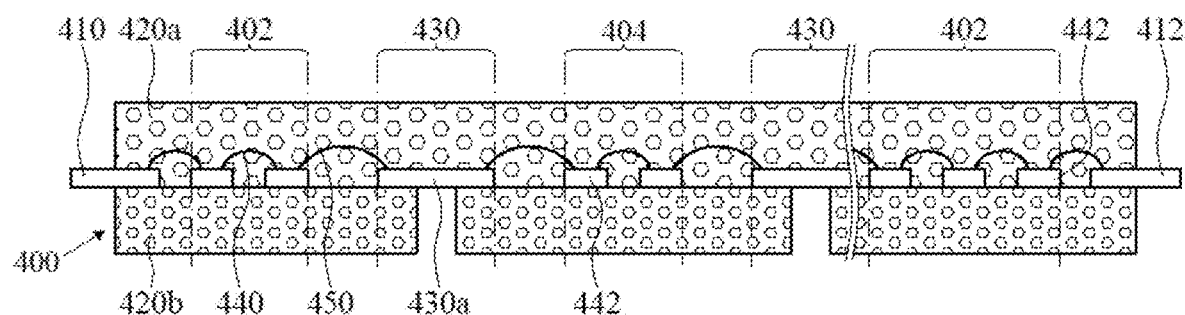

As shown in FIG. 2E, in the present embodiment, the top layer 420a is substantially uniform in width, thickness or diameter in the radial direction of the LED filament, whether in the LED sections 402, 404 or in the conductive section 430. A portion of the base layer 420b has been recessed or hollowed out corresponding to a portion of each conductor 430a, for example, the intermediate portion of the conductor 430a is not covered by the base layer 420b.

Figure 2F:
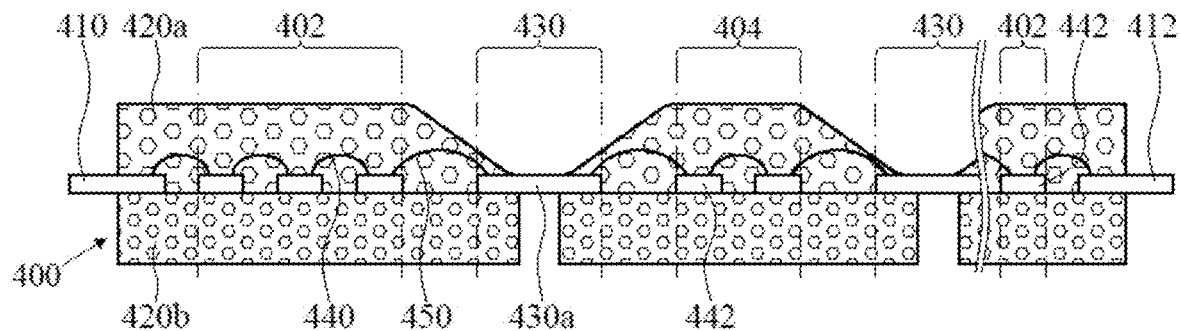

As shown in FIG. 2F, in the present embodiment, the top layer 420a of the LED sections 402, 404 has the largest diameter in the radial direction of the LED filament, and the diameter of the top layer 420a is gradually decreased from the LED sections 402, 404 to the conductive section 430. Moreover, a portion of the conductor 430a (for example, the middle portion) is not covered by the top layer 420a, and a portion of the base layer 420b is recessed or hollowed out such that a portion of the conductor 430a (for example, the intermediate portion) is not covered by the base layer 420b. In other words, at least a portion of the conductor 430a at the opposite sides thereof are not covered by the top layer 420a and the base layer 420b, respectively.

As described above with respect to the embodiments of FIGS. 2D to 2F, when the base layer 420b has a recession region or hollow region corresponding to a part of or all of the conductive sections 430, and the recession region or the hollow region may be in the form of a slit or a groove. Therefore, the conductor 430a is not completely exposed and the conductive section 430 can be provided with better bendability.

Figure 2G:
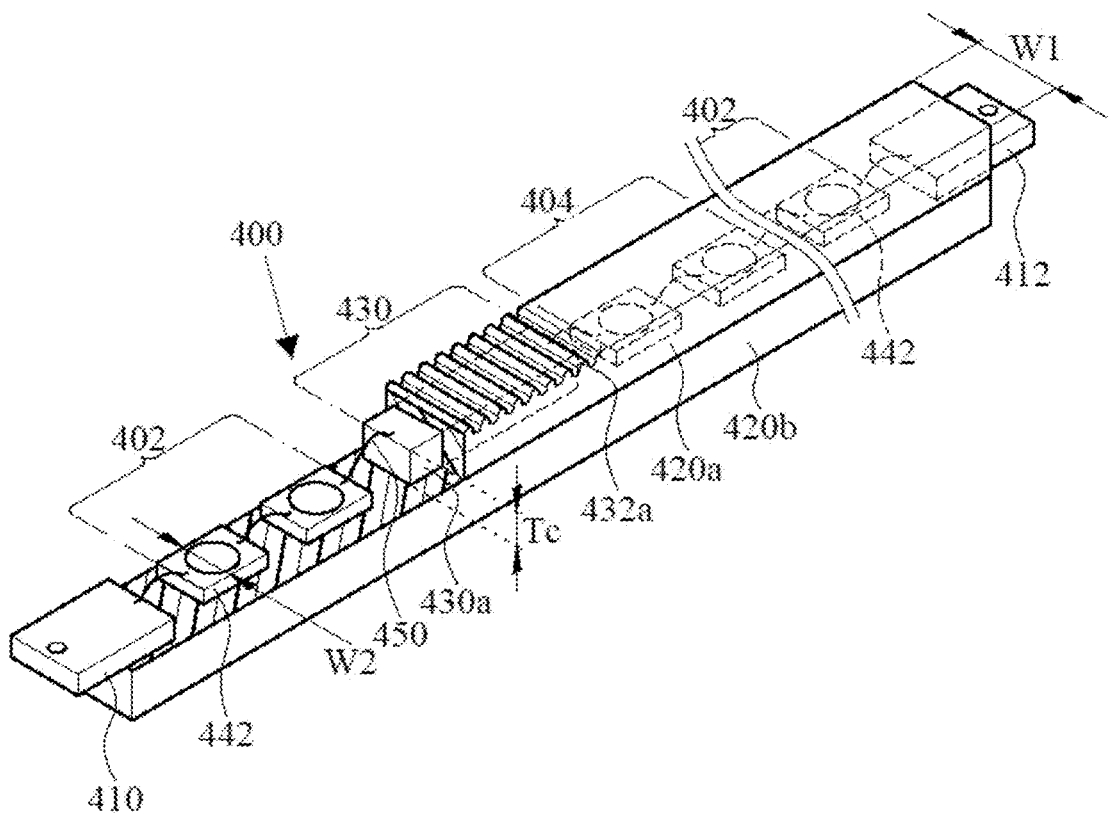
FIG. 2G is perspective views of various LED filaments in accordance with the present invention.

As shown in FIG. 2G, in the present embodiment, the thickness of the conductor 430a is also significantly larger than the thickness of the LED chip 442. Besides, compared with the thickness of the LED chip 442, the thickness of the conductor 430a is closer to the thickness of the top layer 420a corresponding to the conductive section 430. In the width direction of the LED filament, the top layer 420a has a width W 1, and the LED chip 442 has a width W2, and the width W2 of the LED chip 442 is close to the width W1 of the top layer 420a, wherein the width direction is perpendicular to both the axial direction and the aforementioned thickness direction. That is, the top layer 420a is slightly larger than the LED chip 442 in the width direction and slightly larger than the conductor 430a in the thickness direction. In other embodiments, the ratio of the width W1 of the top layer 420a to the width W2 of the LED chip 442 is around 2 to 5, i.e., W1:W2=2~5:1. In the present embodiment, the base layer 420b has the same width W1 as the top layer 420a, but is not limited thereto.

According to the aforementioned embodiments of the present invention, since the LED filament structure is provided with at least one LED section and at least one conductive section, when the LED filament is bent, the stress is easily concentrated on the conductive section. Therefore, the breakage probability of the gold wire connected between the adjacent LED chips is reduced during bending. Thereby, the quality of the LED filament and its application is improved. In addition, the conductive section employs a copper foil structure, which reduces the length of the metal wire bonding and further reduces the breakage probability of the metal wire during bonding. In other embodiments of the invention, in order to improve the bendability of the conductive section, and further prevent the conductor from damaged when the LED filament is bent. The conductor in the LED filament conductive section may be in a shape of "M" or wave profile for providing better flexibility in extending of the LED filament.

Figure 3A:
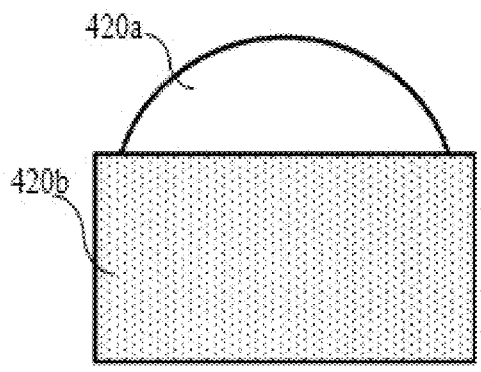
FIGS. 3A to 3D are cross sectional views of various LED filaments in accordance with the present invention.
Figure 3B:
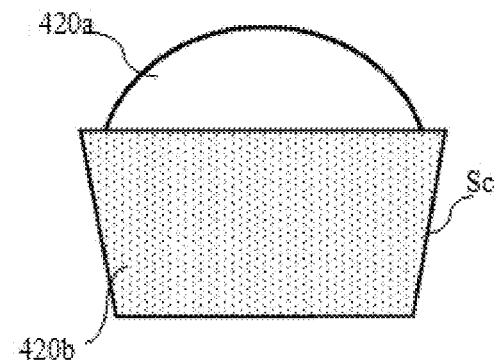
Figure 3C:
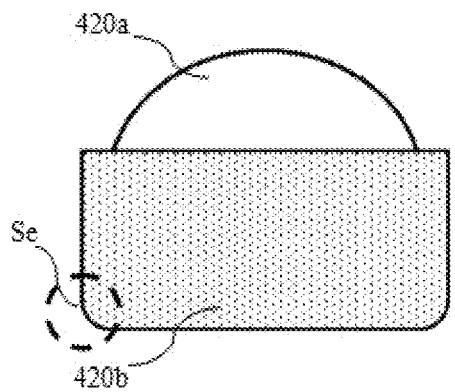
Figure 3D:
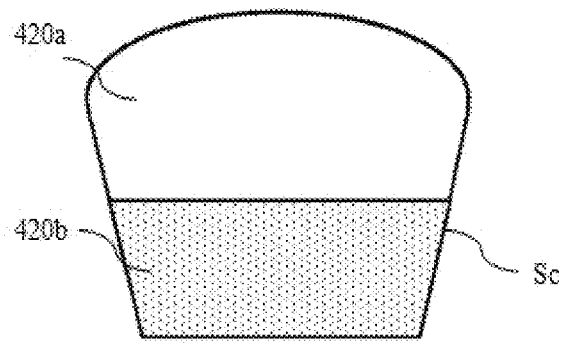

Next, a related design of the layer structure of the LED filament structure will be described. FIGS. 3A to 3C are cross-sectional views of an LED filament according to different embodiments of the present invention. Surfaces of the filaments shown in FIGS. 3A to 3C are with different angles. The top layer 420a in FIG. 3A, FIG. 3B, FIG. 3C may be made by a glue dispenser, and viscosity adjustment to the phosphor glue is made so that both sides of the top layer after the dispensing process naturally collapse to form an arcuate surface. The cross section of the base layer 420b of FIG. 3A is a quadrilateral section formed by vertical cutting. The cross section of the base layer 420b of FIG. 3B is a trapezoidal and has slant edges Sc because the base layer 420b is cut bias or is cut by a cutter with an angular configuration. The base layer 420b of FIG. 3C is similar to that of FIG. 3A, but the two corners located below away the top layer 420a are chamfered in a circular arc Se. Based upon different manufacturing process manners of the above-mentioned about FIGS. 3A to 3C, when the LED chip in the filament is illuminated, the LED filament as a whole can achieve different light emitting angles and light emitting performances. The base layer 420b of FIG. 3D is similar to the base layer 420b of FIG. 3B, but the beveled side Sc of the base layer 420b in FIG. 3D is aligned with the side of the top layer 420a in a straight line, and the cross section of the top layer 420a consists of the arc portion and the oblique portion. In other words, the top layer 420a of FIG. 3D has a beveled side as extending from the beveled side Sc of the base layer 420b, and the two beveled sides of the top layer 420a and the base layer 420b are symmetrically formed on opposite sides of the LED filament. The beveled side of the top layer 420a aligns with the beveled side Sc of the base layer 420b. In this situation, the cross section of the top layer 420a in FIG. 3D will have an outer contour composed of an arched boundary and two opposite beveled sides Sc. In the process of the LED filament manufacturing, the LED chip is completed the die bonding on the surface of the large-area base layer 420a, the top layer 420a is unitarily coated on the upper surface of the large-area base layer 420a, and then performs the cutting process of the LED filament to form the strip LED filament, thereby forming the top layer 420a and the base layer 420b shown in FIG. 3D having the same slope of the bevel sides and both beveled sides of the top and base layers are aligned with a straight line to form a common beveled side Sc.

Figure 3E:
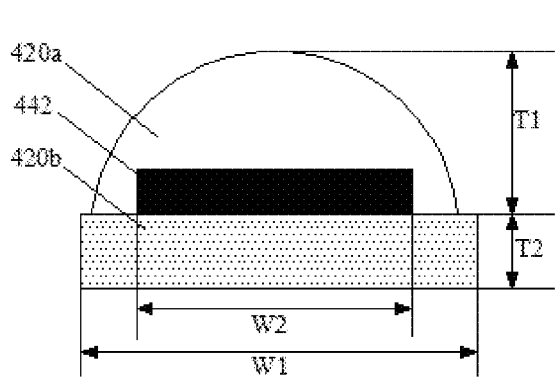
FIGS. 3E and 3F are schematic views showing the placement of the LED chip in FIGS. 3A and 3B.

FIG. 3E is a schematic view showing the arrangement of the LED chip 442 inside the FIG. 3A. The thickness and diameter of the base layer 420b may be smaller than that of the top layer 420a. As shown in FIG. 3E, the thickness T2 of the base layer 420b is smaller than the thickness T1 of the top layer 420a, and the thickness of the base layer 420b or the top layer 420a may be uneven due to the process, therefore, the T1 and T2 represent the maximum thickness of the top layer 420a and the base layer 420b, respectively. Besides, the LED chip 442 is placed on the surface of the base layer 420b and wrapped in the top layer 420a. In some aspects, the conductive electrode of an LED filament (not shown) may be disposed primarily in the base layer 420b. In the case when the thickness of the base layer 420b is thinner than that of the top layer 420a, the heat generated from the LED filament conductive electrode can be more easily dissipated from the base layer 420b. In some aspects, the major emitting direction of the LED chip 442 is to face the top layer 420a, so that most of light emitting from the LED chip 442 will penetrate the top layer 420a, which causes the base layer 420b to have a relatively lower brightness than the top layer 420a. In one embodiment, the top layer 420a has a relatively large amount of light reflecting and/or diffusing particles, for example phosphor particles, which can reflect or diffuse the light toward the base layer 420b, and the light can easily penetrate the thinner base layer 420b, thereby achieving uniform brightness of the top layer 420a and the base layer 420b. In another embodiment, when the top layer 420a and the base layer 420b have the same thickness, the phosphor particle concentration of the top layer 420a can be configured to be greater than the phosphor particle concentration of the base layer 420b, so that the color temperature of the LED filament is more uniform.

Figure 3F:
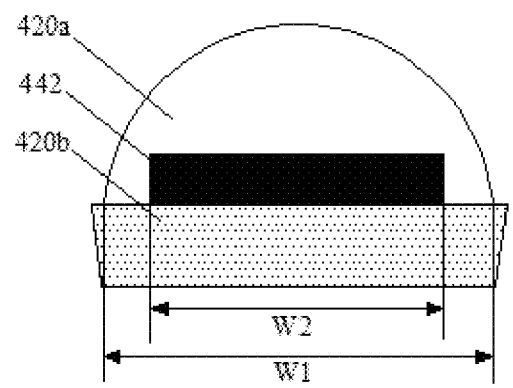

Referring to FIGS. 3E and 3F, W1 is the width of the base layer 420b or the top layer 420a, and W2 is the width of the LED chip 442. When the width of the base layer 420b or the top layer 420a is not uniform, W1 represents the width of the upper surface of the base layer 420b or the width of the lower surface of the top layer 420a, the proportion of W1 and W2 is W1:W2=1:(0.8 to 0.9). The upper surface of the base layer 420b contacts the LED chip 402, and the lower surface thereof is away from the LED chip 442 and opposite to the upper surface of the base layer 420b, in contrast, the upper surface of the top layer 420b is away from the LED chip 442, and the lower surface thereof is opposite to the upper surface of the top layer 420b and contacts the base layer 420a. In FIG. 3E, W1 indicates the width of the upper surface of the base layer 420b or the minimum width of the base layer 420b. FIG. 3F is a schematic view showing the arrangement of the LED chip 402 inside the FIG. 3B, and W1 is the width of the lower surface of the top layer 420b or the maximum width of the top layer 420a. In an embodiment such as the top layer 420a and the base layer 420b of FIG. 3D have a common beveled side Sc, W1 is the width of the lower surface of the top layer 420a or the maximum width of the base layer 420b. The LED chip 442 is a six faced illuminator, in order to ensure lateral illuminating of the LED filament, that is lateral faces of the LED chip 442 are still covered by the top layer 402a, the widths W1 and W2 can be designed to be unequal and the width W1 is greater than the width of W2. On the other hand, in order to ensure that the LED filament has a certain flexibility and can be bent with a small curvature radius, in other words, for making sure that the filament retains a certain degree of flexibility, therefore, the ratio of the thickness and the width of the cross section of the LED filament which is perpendicular to the longitudinal direction of the LED filament is ideally tended to be consistent. With this design, the LED filament can be easily realized with an omni-directional light effect and has a better bending property.

Figure 4:
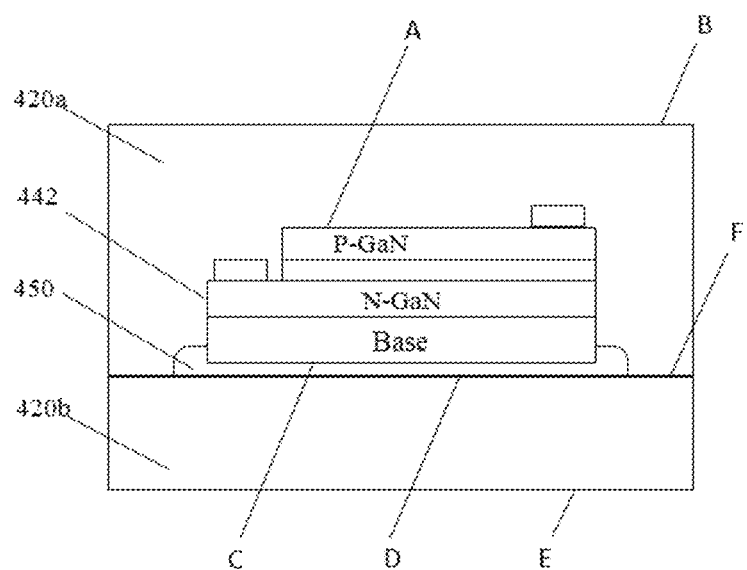
FIG. 4 is a schematic view showing the interfaces passing through by the light emitted by the LED chip in accordance with the present invention.

When the LED filament is illuminated in an LED light bulb encapsulation with the inert gas, as shown in FIG. 4, the light emitted by the LED chip 442 passes through the interfaces A, B, C, D, E and F respectively, wherein the interface A is the interface between the p-GaN gate and the top layer 420a in the LED chip 442. The interface B is the interface between the top layer 420a and the inert gas, the interface C is the interface between the substrate and the paste 450 (e.g., die bond paste) in the LED chip 442, the D interface is the interface between the paste 450 and the base layer 420b, the interface E is the interface between the base layer 420b and the inert gas, and the interface F is the interface between the base layer 420b and the top layer 420a. When light passes through the interfaces A, B, C, D, E and F respectively, the refractive index of the two substances in any interface is n1 and n2 respectively, then |n1−n2|<1.0, preferably |n1−n2|<0.5, more preferably |n1−n2|<0.2. In one embodiment, the refractive index of two substances in any one of the four interfaces of B, E, D and F is n1 and n2 respectively, and then |n1−n2|<1.0, preferably |n1−n2|<0.5, More preferably |n1−n2|<0.2. In one embodiment, the refractive index of two substances in any interface of D and F two interfaces is n1 and n2 respectively, then |n1−n2|<1.0, preferably |n1−n2|<0.5, preferably |n1−n2|<0.2. The absolute value of the difference in refractive index of the two substances in each interface is smaller, the light emitting efficiency is higher. For example, when the light emitted by the LED chip 442 passes from the base layer 420b to the top layer 420a, the incident angle is θ1, the refraction angle is θ2, and the refractive index of the base layer 420b is n1, and the refractive index of the top layer 420a is n2, according to the equation sin θ1/sin θ2=n2/n1, when the absolute value of the difference between n1 and n2 is smaller, the incident angle closer to the refraction angle, and then the light-emitting efficiency of the LED filament is higher.

Figure 5A:
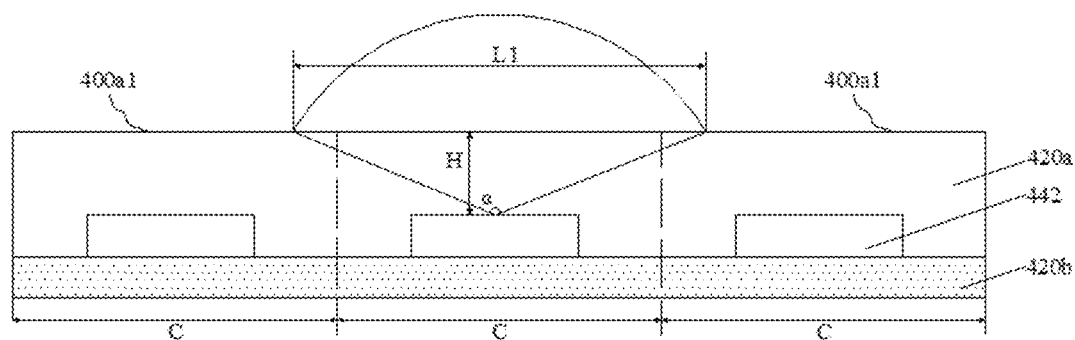
FIG. 5A is a cross sectional view showing the LED filament in the axial direction of the LED filament.
Figure 5B:
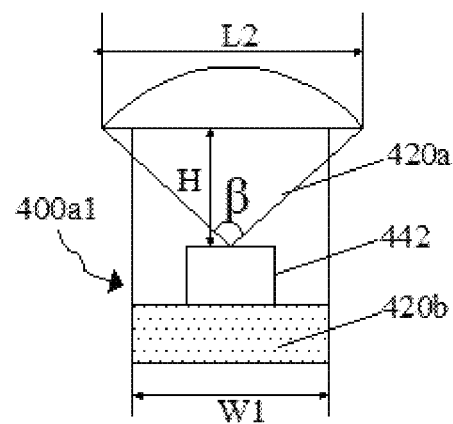
FIG. 5B is a cross-sectional view showing the LED filament in the radial direction of the LED filament.

Referring to FIG. 5A, FIG. 5A shows the cross sectional view of a portion of the LED filament 400 in the longitudinal direction of the LED filament 400, FIG. 5A shows three LED filament units 400a1 and each LED filament unit 400a1 includes a single LED chip 442. FIG. 5B is a cross sectional view of the LED filament unit 400a1 in the short axial direction of the LED filament. As shown in FIGS. 5A and 5B, the illumination angle of the LED chip 442 in the longitudinal direction of the LED filament is α, the illumination angle of the LED chip 442 in the short axial direction of the LED filament is β, and the surface of the LED chip 442 away from the base layer 420b is defined by the upper surface of the LED chip 442, the distance from the upper surface of the LED chip 442 to the outer surface of the top layer is H, and the length of the LED filament unit 400a1 in the longitudinal direction of the LED filament is C, and the light emitting area of an LED chip 442 in the LED filament in the longitudinal direction of the LED filament is the illumination coverage of the illumination angle α, the LED chip emits the light along with the illumination angle α and it projects on the outer surface of the top layer 420a with a length of the linear distance L1. The light emitting area of an LED chip 442 in the LED filament in the short axial direction of the LED filament is the illumination coverage of the illumination angle β, the LED chip emits the light along with the illumination angle β and it projects on the outer surface of the top layer 420a with a length of the linear distance L2. It is considered that the LED filament has ideal light emitting area, better bending property, thermal dissipation performance, avoiding to occur obvious dark areas of LED filament and reducing material waste, etc. at the same time, the L1 value can be designed by the equation as $0.5C \le L1 \le 10C$, preferably $C \le L1 \le 2C$. Further, under the equation $L2 \ge W1$, if the L1 value is smaller than the C value, the light emitting areas of the adjacent LED chips 442 in the longitudinal direction cannot be intersected, therefore the LED filament may have a dark area in the longitudinal direction. Moreover, when the L2 value is smaller than the W1 value, it represents the width of the LED chip 442 in the short axial direction of the filament is too large, and it is also possible to cause the top layer 420a having dark areas on both sides in the short axial direction. The dark areas not only affect the overall light illumination efficiency of the LED filament, but also indirectly cause waste of material use. The specific values of α, β depend on the type or specification of the LED chip 442.

In one embodiment, in the longitudinal direction of the LED filament:

$$H = L1/2 \tan 0.5\alpha, 0.5C \le L1 \le 10C, \text{ then } 0.5C/2 \tan 0.5\alpha \le H \le 10C/2 \tan 0.5\alpha;$$

in the short axial direction of the LED:

$$H = L2/2 \tan 0.5\beta, L2 \ge W1, \text{ then } H \ge W1/2 \tan 0.5\beta;$$

therefore, Hmax=10C/2 tan 0.5α, Hmin=a; setting a is the maximum of both values, 0.5C/2 tan 0.5α and W1/2 tan 0.5β, and setting A is the maximum of both values, C/2 tan 0.5α and W1/2 tan 0.5 β.

Thus, the equation between the distance H and the setting value a and A respectively as $a \le H \le 10C/2 \tan 0.5\alpha$, preferably $A \le H \le 2C/2 \tan 0.5\alpha$. When the type of the LED chip 442, the spacing between adjacent LED chips, and the width of the filament are known, the distance H from the light emitting surface of the LED chip 442 to the outer surface of the top layer can be determined, so that the LED filament has a superior light emitting area in both the short axial and longitudinal direction of the LED filament.

Most LED chips have an illumination angle of 120° in both the short axial and longitudinal direction of the LED filament. The setting b is the maximum of 0.14C and 0.28W1, and B is the maximum of 0.28C and 0.28W1, then the equation between the distance H and the setting value b and B respectively as $b \le H \le 2.9C$ and preferably $B \le H \le 0.58C$.

In one embodiment, in the longitudinal direction of the LED filament:

$$H = L1/2 \tan 0.5\alpha, 0.5C \le L1 \le 10C;$$

in the short axial direction of the LED filament:

$$H = L2/2 \tan 0.5\beta, L2 \ge W1; \text{ then } W1 \le 2H \tan 0.5\beta;$$

then 0.5C tan 0.5β/tan 0.5α ≤ L2 ≤ 10C tan 0.5β/tan 0.5α, L2 ≥ W1;

therefore, W1 ≤ 10C tan 0.5β/tan 0.5α, thus W1max=min (10C tan 0.5β/tan 0.5α, 2H tan 0.5β).

The relationship between the LED chip width W2 and the base layer width W1 is set to W1:W2=1:0.8 to 0.9, so that the minimum of W1 as W1min=W2/0.9 can be known.

Setting d is the minimum of 10C tan 0.5β/tan 0.5α and 2H tan 0.5β, and D is the minimum of 2C tan 0.5β/tan 0.5α and 2H tan 0.5β, then the equation between the base layer width W1, the LED chip width W2, and the setting value d and D respectively is $W2/0.9 \le W1 \le d$, preferably $W2/0.9 \le W1 \le D$.

When the type of the LED chip 442, the distance between the adjacent two LED chips in the LED filament, and the H value are known, the range of the width W of the LED filament can be calculated, so that the LED filament can be ensured in the short axial direction and the longitudinal direction of the LED filament both have superior light emitting areas.

Most of the LED chips have an illumination angle of 120° in the short axial and in the longitudinal direction of the LED filament, the e is set to a minimum value of 10C and 3.46H, and the E is set to a minimum value of 2C and 3.46H, in the case the equation between the width W1, W2 and the setting value e and E respectively as $1.1W2 \leq W1 \leq e$, preferably $1.1W2 \leq W1 \leq E$.

In one embodiment, in the longitudinal direction of the LED filament:

$H=L1/2 \tan 0.5\alpha, 0.5C \leq L1 \leq 10C$, then $0.2H \tan 0.5\alpha \leq C \leq 4H \tan 0.5\alpha$;

in the short axial direction of the LED filament:

$H=L2/2 \tan 0.5\beta, L2 \geq W1$, then $L1 \geq W1 \tan 0.5\alpha/\tan 0.5\beta$;

thus $W1 \tan 0.5\alpha/\tan 0.5\beta \leq 10C$, and $C \geq 0.1W1 \tan 0.5\alpha/\tan 0.5\beta$;

then $Cmax=4H \tan 0.5\alpha$.

Setting f is the maximum value of both $0.2H \tan 0.5\alpha$ and $0.1W1 \tan 0.5\alpha/\tan 0.5\beta$, and setting F is the maximum value of both $H \tan 0.5\alpha$ and $0.1W1 \tan 0.5\alpha/\tan 0.5\beta$, therefore $f \leq C \leq 4H \tan 0.5\alpha$, preferably $F \leq C \leq 2H \tan 0.5\alpha$.

When the width W, the H value, and type of the LED chip 442 of the LED filament are determined, the range of the width C of the LED filament can be known, so that the LED filament has superior light emitting area in both the short axial direction and the longitudinal direction of the LED filament.

Most LED chips have an illumination angle of 120° in the short axial direction and in the longitudinal direction of the LED filament of the LED filament. The setting g is the maximum value of 0.34H and 0.1W1, and setting G is the maximum value of 1.73H and 0.1W1, thereby the equation between the value C, H and the setting value g and G respectively as $g \leq C \leq 6.92H$, preferably $G \leq C \leq 3.46H$.

In the above embodiment, since the thickness of the LED chip 442 is small relative to the thickness of the top layer 420a, it is negligible in most cases, that is, the H value may also represent the actual thickness of the top layer 420a. In one embodiments, the light conversion layer is similar to the structure of the light conversion layer 420 as shown in FIG. 2A, for example, only the position of the conductive electrode shown in FIG. 2A is different, and the height of the top layer 420a is suitable for the range of the H value as the aforementioned equation.

Figure 6A:
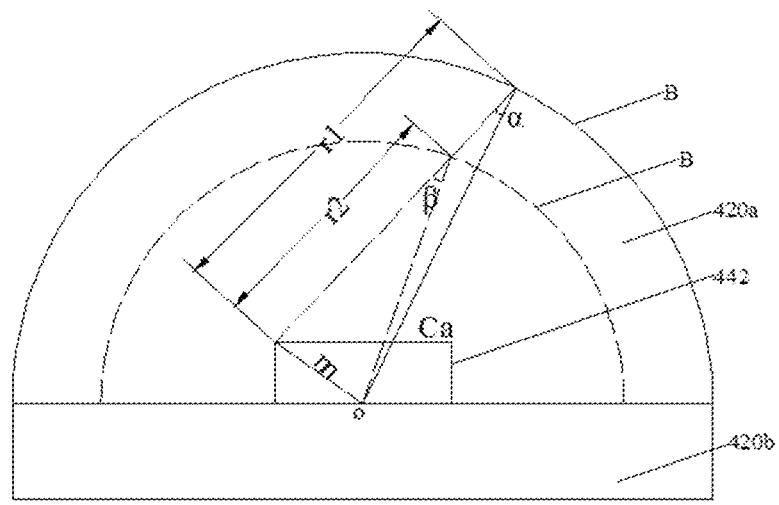
FIGS. 6A and 6B are cross sectional views showing different top layers 420a of the LED filament units 400a1.
Figure 6B:
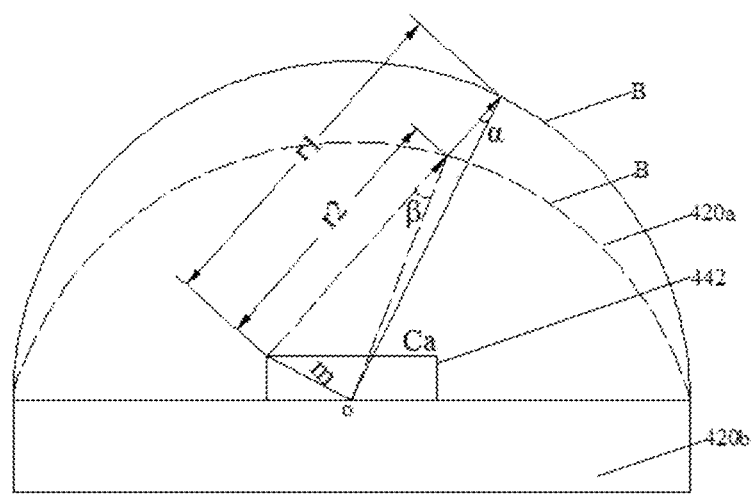
Figure 6C:
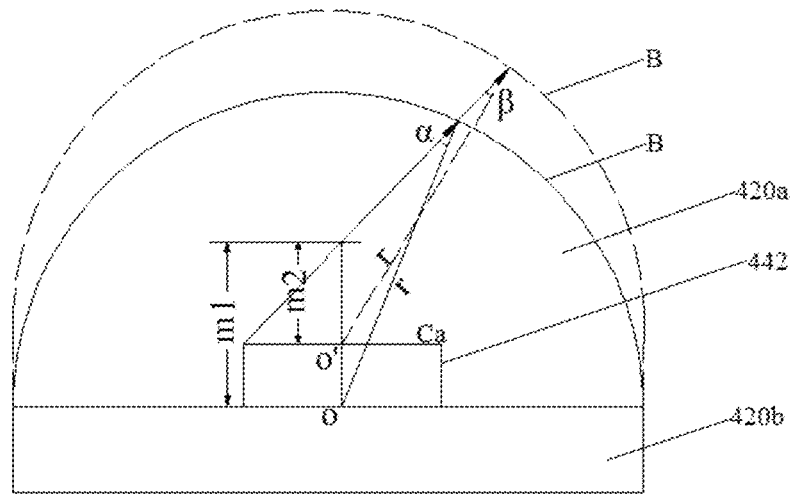
FIG. 6C is a cross sectional view showing another embodiment of the LED filament in accordance with the present invention.

Referring to FIGS. 6A and 6B, FIGS. 6A and 6B are cross sectional views of the LED filament unit 400a1 having different thickness of the top layers 420a, and the surface of the LED chip 442 opposite to the interface between the LED chip 442 and the base layer 420b is referred to as light emitting surface Ca. In one embodiment, as shown in FIG. 6A, the shape of the top layer 420a is a semicircle with different diameters, for example the dashed line illustrated another diameter, and the center o of the top layer 420a is not located on the light emitting surface Ca of the LED chip 442, further, the distance that the emitting light projected onto the circumference of the outer surface of the top layer 420a is r1, r2, respectively. When the light emitting traverses the interface B, that is the interface between the top layer and the inert gas, the incident angles formed at the interfaces of the radii r1 and r2 of the top layer 420a are α, β, respectively. It can be known from the equation $\tan \alpha=m/r1$ and $\tan \beta=m/r2$ that the radius is larger, the incident angle is smaller, and the light emitting efficiency of the LED filament is higher. That is to say, when the top layer 420a has a semicircular shape, the maximum radius/diameter value should be taken as much as possible to obtain a better light emitting efficiency. In another embodiment, as shown in FIG. 6B, a top layer 420a has a semicircular shape, and the other top layer 420a has an elliptical shape, wherein the major axis of the ellipse has the same length as the diameter of the semicircular shape, and the center point o of the top layer 420a and the center point o of the ellipse do not overlap with the light emitting surface Ca of the LED chip 442. As shown in FIG. 6B, when the emitted light passes through the interface B in the same direction, the distances of the emitting light on the circumference and the elliptical arc are r1 and r2 respectively, and the incident angles are α and β, respectively, from the equations $\tan \alpha=m/r1$ and $\tan \beta=m/r2$, it can be seen that the larger the r1 and r2, the smaller the incident angle, the higher the light emitting efficiency of the LED filament. In other words, in compared to the elliptical shape, the cross section of the top layer 420a in the shape of semicircular has better light emitting efficiency, that is, the distance from the center point of the LED chip to the outer surface of the top layer is substantially the same. As shown in FIG. 6C, the center O of the top layer 420a indicated by the solid line does not overlap with the light emitting surface Ca of the LED chip, and the center O' of the top layer 420a indicated by the dashed line overlaps with the light emitting surface of the LED chip, and the radius of the semicircle with the center of O and the radius of the semicircle of O' is equal. As shown in the figure, $\tan \alpha=m1/r$ and $\tan \beta=m2/r$, m1 is greater than m2, and thus α is greater than β, so that when the light emitting surface overlaps with the center of the top layer 420a, that is the distance from the center point to the outer surface of the top layer is substantially the same, the light emitting efficiency is better.

The LED chip used in the aforementioned embodiments can be replaced by a back plated chip, and the plated metal is silver or gold alloy. When the back plated chip is used, the specular reflection can be enhanced, and the luminous flux of the light emitted from the light emitting surface A of the LED chip can be increased.

Figure 7A:
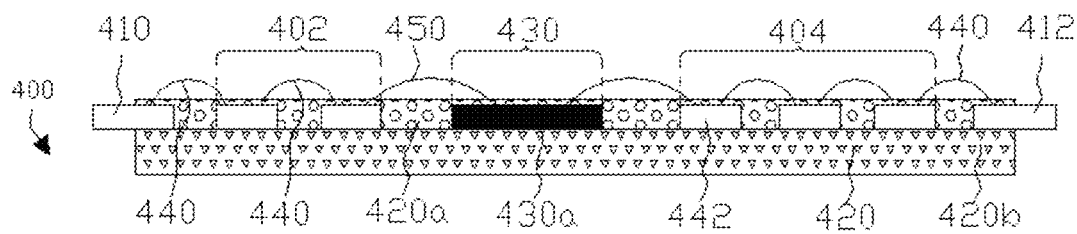
FIG. 7A is a schematic structural view showing an embodiment of a layered structure of an LED filament in accordance with the present invention.
Figure 7B:
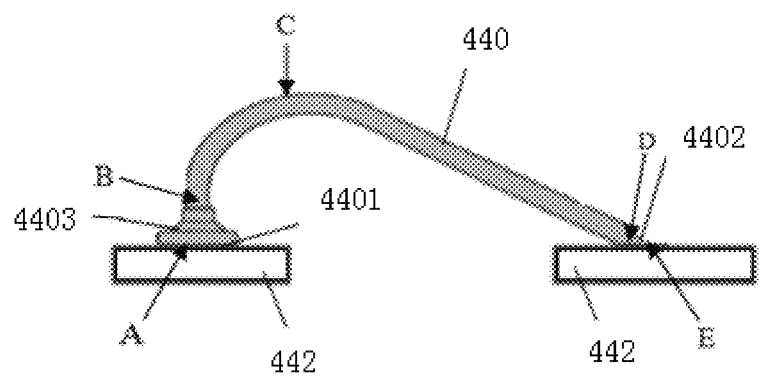
FIG. 7B is a schematic structural view of an LED chip bonding wire of an embodiment in accordance with the present invention.

FIG. 7A is a schematic view showing an embodiment of a layered structure of the LED filament 400 of the present invention. The LED filament 400 has a light conversion layer 420, two LED chip units 402, 404, two conductive electrodes 410, 412, and a conductive section 430 for electrically connecting adjacent two LED chip units 402, 404. Each of the LED chip units 402, 404 includes at least two LED chips 442 that are electrically connected to each other by wires 440. In the present embodiment, the conductive section 430 includes a conductor 430, and the conductive section 430 is electrically connected to the LED sections 402, 404 through the wires 450. The shortest distance between the two LED chips 442 located in the adjacent two LED chip units 402, 404 is greater than the distance between adjacent two LED chips in the same chip unit 402/404. Moreover, the length of wire 440 is less than the length of conductor 430a. The light conversion layer 420 is disposed on the LED chip 442 and at least two sides of the conductive electrodes 410, 412. The light conversion layer 420 exposes a portion of the conductive electrodes 410, 412. The light conversion layer 420 may be composed of at least one top layer 420a and one base layer 420b as the upper layer and the lower layer of the LED filament respectively. In the present embodiment, the LED chips 442 and the conductive electrodes 410, 412 are sandwiched in between the top layer 420a and the base layer 420b. When the wire bonding process of the face up chip is carried out along the x direction, for example, the bonding wire and the bonding conductor are gold wires, the quality of the bonding wire is mainly determined by the stress at the five points A, B, C, D, and E as shown in FIG. 7B. The point A is the junction of the soldering pad 4401 and the gold ball 4403, point B is the junction of the gold ball 4403 and the gold wire 440, point C is between the two segments of the gold wire 440, point D is the gold wire 440 and the two solder butted joints 4402, and the point E is between the two solder butted joints 4402 and the surface of the chip 442. Because of point B is the first bending point of the gold wire 440, and the gold wire 440 at the point D is thinner, thus gold wire 440 is frangible at points B and D. So that, for example, in the implementation of the structure of the LED filament 300 package showing in FIG. 7A, the top layer 420a only needs to cover points B and D, and a portion of the gold wire 440 is exposed outside the light conversion layer. If one of the six faces of the LED chip 442 farthest from the base layer 420b is defined as the upper surface of the LED chip 442, the distance from the upper surface of the LED chip 442 to the surface of the top layer 420a is in a range of around 100 to 200 μm.

The next part will describe the material of the filament of the present invention. The material suitable for manufacturing a filament substrate or a light-conversion layer for LED should have properties such as excellent light transmission, good heat resistance, excellent thermal conductivity, appropriate refraction rate, excellent mechanical properties and good warpage resistance. All the above properties can be achieved by adjusting the type and the content of the main material, the modifier and the additive contained in the organosilicon-modified polyimide composition. The present disclosure provides a filament substrate or a light-conversion layer formed from a composition comprising an organosilicon-modified polyimide. The composition can meet the requirements on the above properties. In addition, the type and the content of one or more of the main material, the modifier (thermal curing agent) and the additive in the composition can be modified to adjust the properties of the filament substrate or the light-conversion layer, so as to meet special environmental requirements. The modification of each property is described herein below.

Adjustment of the Organosilicon-Modified Polyimide

The organosilicon-modified polyimide provided herein comprises a repeating unit represented by the following general formula (I):

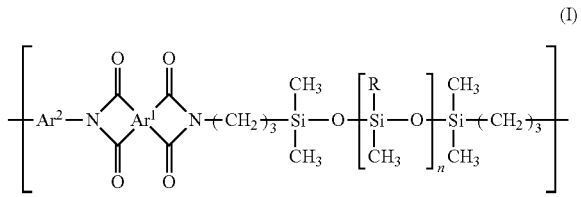

(I)

In general formula (I), $Ar^1$ is a tetra-valent organic group. The organic group has a benzene ring or an alicyclic hydrocarbon structure. The alicyclic hydrocarbon structure may be monocyclic alicyclic hydrocarbon structure or a bridged-ring alicyclic hydrocarbon structure, which may be a dicyclic alicyclic hydrocarbon structure or a tricyclic alicyclic hydrocarbon structure. The organic group may also be a benzene ring or an alicyclic hydrocarbon structure comprising a functional group having active hydrogen, wherein the functional group having active hydrogen is one or more of hydroxyl, amino, carboxy, amido and mercapto.

$Ar^2$ is a di-valent organic group, which organic group may have for example a monocyclic alicyclic hydrocarbon structure or a di-valent organic group comprising a functional group having active hydrogen, wherein the functional group having active hydrogen is one or more of hydroxyl, amino, carboxy, amido and mercapto.

R is each independently methyl or phenyl.

n is 1~5, preferably 1, 2, 3 or 5.

The polymer of general formula (I) has a number average molecular weight of 5000~100000, preferably 10000~60000, more preferably 20000~40000. The number average molecular weight is determined by gel permeation chromatography (GPC) and calculated based on a calibration curve obtained by using standard polystyrene. When the number average molecular weight is below 5000, a good mechanical property is hard to be obtained after curing, especially the elongation tends to decrease. On the other hand, when it exceeds 100000, the viscosity becomes too high and the resin is hard to be formed.

$Ar^1$ is a component derived from a dianhydride, which may be an aromatic anhydride or an aliphatic anhydride. The aromatic anhydride includes an aromatic anhydride comprising only a benzene ring, a fluorinated aromatic anhydride, an aromatic anhydride comprising amido group, an aromatic anhydride comprising ester group, an aromatic anhydride comprising ether group, an aromatic anhydride comprising sulfide group, an aromatic anhydride comprising sulfonyl group, and an aromatic anhydride comprising carbonyl group.

Examples of the aromatic anhydride comprising only a benzene ring include pyromellitic dianhydride (PMDA), 2,3,3',4'-biphenyl tetracarboxylic dianhydride (aBPDA), 3,3',4,4'-biphenyl tetracarboxylic dianhydride (sBPDA), and 4-(2,5-dioxotetrahydrofuran-3-yl)-1,2,3,4-tetrahydro naphthalene-1,2-dicarboxylic anhydride (TDA). Examples of the fluorinated aromatic anhydride include 4,4'-(hexafluoroisopropylidene)diphthalic anhydride which is referred to as 6FDA. Examples of the aromatic anhydride comprising amido group include N,N'-(5,5'-(perfluoropropane-2,2-diyl) bis(2-hydroxy-5,1-phenylene))bis(1,3-dioxo-1,3-dihydroisobenzofuran)-5-arboxamide) (6FAP-ATA), and N,N'-(9H-fluoren-9-ylidenedi-4,1-phenylene)bis[1,3-dihydro-1,3-dioxo-5-isobenzofuran carboxamide] (FDA-ATA). Examples of the aromatic anhydride comprising ester group include p-phenylene bis(trimellitate) dianhydride (TAHQ). Examples of the aromatic anhydride comprising ether group include 4,4'-(4,4'-isopropylidenediphenoxy)bis(phthalic anhydride) (BPADA), 4,4'-oxydiphthalic dianhydride (sODPA), 2,3,3',4'-diphenyl ether tetracarboxylic dianhydride (aODPA), and 4,4'-(4,4'-isopropylidenediphenoxy)bis (phthalic anhydride)(BPADA). Examples of the aromatic anhydride comprising sulfide group include 4,4'-bis(phthalic anhydride)sulfide (TPDA). Examples of the aromatic anhydride comprising sulfonyl group include 3,3',4,4'-diphenylsulfonetetracarboxylic dianhydride (DSDA). Examples of the aromatic anhydride comprising carbonyl group include 3,3',4,4'-benzophenonetetracarboxylic dianhydride (BTDA).

The alicyclic anhydride includes 1,2,4,5-cyclohexanetetracarboxylic acid dianhydride which is referred to as HPMDA, 1,2,3,4-butanetetracarboxylic dianhydride (BDA), tetrahydro-1H-5,9-methanopyrano[3,4-d]oxepine-1,3,6,8(4H)-tetrone (TCA), hexahydro-4,8-ethano-1H,3H-benzo [1,2-C:4,5-C'']difuran-1,3,5,7-tetrone (BODA), cyclobutane-1,2,3,4-tetracarboxylic dianhydride (CBDA), and 1,2,3,4-cyclopentanetetracarboxylic dianhydride (CpDA); or alicyclic anhydride comprising an olefin structure, such as bicyclo[2.2.2]oct-7-ene-2,3,5,6-tetracarboxylic dianhydride (COeDA). When an anhydride comprising ethynyl such as 4,4'-(ethyne-1,2-diyl)diphthalic anhydride (EBPA) is used, the mechanical strength of the light-conversion layer can be further ensured by post-curing.

Considering the solubility, 4,4'-oxydiphthalic anhydride (sODPA), 3,3',4,4'-benzophenonetetracarboxylic dianhydride (BTDA), cyclobutanetetracarboxylic dianhydride (CBDA) and 4,4'-(hexafluoroisopropylidene)diphthalic anhydride (6FDA) are preferred. The above dianhydride can be used alone or in combination.

$Ar^2$ is derived from diamine which may be an aromatic diamine or an aliphatic diamine. The aromatic diamine includes an aromatic diamine comprising only a benzene ring, a fluorinated aromatic diamine, an aromatic diamine comprising ester group, an aromatic diamine comprising ether group, an aromatic diamine comprising amido group, an aromatic diamine comprising carbonyl group, an aromatic diamine comprising hydroxyl group, an aromatic diamine comprising carboxy group, an aromatic diamine comprising sulfonyl group, and an aromatic diamine comprising sulfide group.

The aromatic diamine comprising only a benzene ring includes m-phenylenediamine, p-phenylenediamine, 2,4-diaminotoluene, 2,6-diamino-3,5-diethyltoluene, 3,3'-dimethylbiphenyl-4,4'-diamine, 9,9-bis(4-aminophenyl)fluorene (FDA), 9,9-bis(4-amino-3-methylphenyl)fluorene, 2,2-bis(4-aminophenyl)propane, 2,2-bis(3-methyl-4-aminophenyl)propane, 4,4'-diamino-2,2'-dimethylbiphenyl(APB). The fluorinated aromatic diamine includes 2,2'-bis(trifluoromethyl)benzidine (TFMB), 2,2-bis(4-aminophenyl)hexafluoropropane (6FDAM), 2,2-bis[4-(4-aminophenoxy)phenyl]hexafluoropropane (HFBAPP), and 2,2-bis(3-amino-4-methylphenyl)hexafluoropropane (BIS-AF-AF). The aromatic diamine comprising ester group includes [4-(4-aminobenzoyl)oxyphenyl]4-aminobenzoate (ABHQ), bis(4-aminophenyl)terephthalate (BPTP), and 4-aminophenyl 4-aminobenzoate (APAB). The aromatic diamine comprising ether group includes 2,2-bis[4-(4-aminophenoxy)phenyl]propane)(BAPP), 2,2'-bis[4-(4-aminophenoxy)phenyl]propane (ET-BDM), 2,7-bis(4-aminophenoxy)-naphthalene (ET-2,7-Na), 1,3-bis(3-aminophenoxy)benzene (TPE-M), 4,4'-[1,4-phenyldi(oxy)]bis[3-(trifluoromethyl)aniline] (p-6FAPB), 3,4'-diaminodiphenyl ether, 4,4'-diaminodiphenyl ether (ODA), 1,3-bis(4-aminophenoxy)benzene (TPE-R), 1,4-bis(4-aminophenoxy)benzene (TPE-Q), and 4,4'-bis(4-aminophenoxy)biphenyl(BAPB). The aromatic diamine comprising amido group includes N,N'-bis(4-aminophenyl)benzene-1,4-dicarboxamide (BPTPA), 3,4'-diamino benzanilide (m-APABA), and 4,4'-diaminobenzanilide (DABA). The aromatic diamine comprising carbonyl group includes 4,4'-diaminobenzophenone (4,4'-DABP), and bis(4-amino-3-carboxyphenyl) methane (or referred to as 6,6'-diamino-3,3'-methylanediyl-dibenzoic acid). The aromatic diamine comprising hydroxyl group includes 3,3'-dihydroxybenzidine (HAB), and 2,2-bis(3-amino-4-hydroxyphenyl)hexafluoropropane (6FAP). The aromatic diamine comprising carboxy group includes 6,6'-diamino-3,3'-methylanediyl-dibenzoic acid (MBAA), and 3,5-diaminobenzoic acid (DBA). The aromatic diamine comprising sulfonyl group includes 3,3'-diaminodiphenyl sulfone (DDS),4,4'-diaminodiphenyl sulfone, bis[4-(4-aminophenoxy)phenyl]sulfone (BAPS) (or referred to as 4,4'-bis(4-aminophenoxy)diphenylsulfone), and 3,3'-diamino-4,4'-dihydroxydiphenyl sulfone (ABPS). The aromatic diamine comprising sulfide group includes 4,4'-diaminodiphenyl sulfide.

The aliphatic diamine is a diamine which does not comprise any aromatic structure (e.g., benzene ring). The aliphatic diamine includes monocyclic alicyclic amine and straight chain aliphatic diamine, wherein the straight chain aliphatic diamine include siloxane diamine, straight chain alkyl diamine and straight chain aliphatic diamine comprising ether group. The monocyclic alicyclic diamine includes 4,4'-diaminodicyclohexylmethane (PACM), and 3,3'-dimethyl-4,4-diaminodicyclohexylmethane (DMDC). The siloxane diamine (or referred to as amino-modified silicone) includes α,ω-(3-aminopropyl)polysiloxane (KF8010), X22-161A, X22-161B, NH15D, and 1,3-bis(3-aminopropyl)-1,1,3,3-tetramethyldisiloxane (PAME). The straight chain alkyl diamine has 6~12 carbon atoms, and is preferably unsubstituted straight chain alkyl diamine. The straight chain aliphatic diamine comprising ether group includes ethylene glycol di(3-aminopropyl) ether.

The diamine can also be a diamine comprising fluorenyl group. The fluorenyl group has a bulky free volume and rigid fused-ring structure, which renders the polyimide good heat resistance, thermal and oxidation stabilities, mechanical properties, optical transparency and good solubility in organic solvents. The diamine comprising fluorenyl group, such as 9,9-bis(3,5-difluoro-4-aminophenyl)fluorene, may be obtained through a reaction between 9-fluorenone and 2,6-dichloroaniline. The fluorinated diamine can be 1,4-bis(3'-amino-5'-trifluoromethylphenoxy)biphenyl, which is a meta-substituted fluorine-containing diamine having a rigid biphenyl structure. The meta-substituted structure can hinder the charge flow along the molecular chain and reduce the intermolecular conjugation, thereby reducing the absorption of visible lights. Using asymmetric diamine or anhydride can increase to some extent the transparency of the organosilicon-modified polyimide resin composition. The above diamines can be used alone or in combination.

Examples of diamines having active hydrogen include diamines comprising hydroxyl group, such as 3,3'-diamino-4,4'-dihydroxybiphenyl, 4,4'-diamino-3,3'-dihydroxy-1,1'-biphenyl (or referred to as 3,3'-dihydroxybenzidine) (HAB), 2,2-bis(3-amino-4-hydroxyphenyl)propane (BAP), 2,2-bis(3-amino-4-hydroxyphenyl)hexafluoropropane (6FAP), 1,3-bis(3-hydro-4-aminophenoxy) benzene, 1,4-bis(3-hydroxy-4-aminophenyl)benzene and 3,3'-diamino-4,4'-dihydroxydiphenyl sulfone (ABPS). Examples of diamines comprising carboxy group include 3,5-diaminobenzoic acid, bis(4-amino-3-carboxyphenyl)methane (or referred to as 6,6'-diamino-3,3'-methylenedibenzoic acid), 3,5-bis(4-aminophenoxy)benzoic acid, and 1,3-bis(4-amino-2-carboxyphenoxy)benzene. Examples of diamines comprising amino group include 4,4'-diaminobenzanilide (DABA), 2-(4-aminophenyl)-5-aminobenzoimidazole, diethylenetriamine, 3,3'-diaminodipropylamine, triethylenetetramine, and N,N'-bis(3-aminopropyl)ethylenediamine (or referred to as N,N-di(3-aminopropyl)ethylethylamine). Examples of diamines comprising thiol group include 3,4-diaminobenzenethiol. The above diamines can be used alone or in combination.

The organosilicon-modified polyimide can be synthesized by well-known synthesis methods. For example, it can be prepared from a dianhydride and a diamine which are dissolved in an organic solvent and subjected to imidation in the presence of a catalyst. Examples of the catalyst include acetic anhydride/triethylamine, and valerolactone/pyridine. Preferably, removal of water produced in the azeotropic process in the imidation is promoted by using a dehydrant such as toluene.

Polyimide can also be obtained by carrying out an equilibrium reaction to give a poly(amic acid) which is heated to dehydrate. In other embodiments, the polyimide backbone may have a small amount of amic acid. For example, the ratio of amic acid to imide in the polyimide molecule may be 1~3:100. Due to the interaction between amic acid and the epoxy resin, the substrate has superior properties. In other embodiments, a solid state material such as a thermal curing agent, inorganic heat dispersing particles and phosphor can also be added at the state of poly(amic acid) to give the substrate. In addition, solubilized polyimide can also be obtained by direct heating and dehydration after mixing of alicylic anhydride and diamine. Such solubilized polyimide, as an adhesive material, has a good light transmittance. In addition, it is liquid state; therefore, other solid materials (such as the inorganic heat dispersing particles and the phosphor) can be dispersed in the adhesive material more sufficiently.

In one embodiment for preparing the organosilicon-modified polyimide, the organosilicon-modified polyimide can be produced by dissolving the polyimide obtained by heating and dehydration after mixing a diamine and an anhydride and a siloxane diamine in a solvent. In another embodiment, the amidic acid, before converting to polyimide, is reacted with the siloxane diamine.

In addition, the polyimide compound may be obtained by dehydration and ring-closing and condensation polymerization from an anhydride and a diamine, such as an anhydride and a diamine in a molar ratio of 1:1. In one embodiment, 200 micromole (mmol) of 4,4'-(hexafluoroisopropylidene) diphthalic anhydride (6FDA), 20 micromole (mmol) of 2,2-bis(3-amino-4-hydroxyphenyl)hexafluoropropane (6FAP), 50 micromole (mmol) of 2,2'-di(trifluoromethyl) diaminobiphenyl(TFMB) and 130 micromole (mmol) of aminopropyl-terminated poly(dimethylsiloxane) are used to give the PI synthesis solution.

The above methods can be used to produce amino-terminated polyimide compounds. However, other methods can be used to produce carboxy-terminated polyimide compounds. In addition, in the above reaction between anhydride and diamine, where the backbone of the anhydride comprises a carbon-carbon triple bond, the affinity of the carbon-carbon triple bond can promote the molecular structure. Alternatively, a diamine comprising vinyl siloxane structure can be used.

The molar ratio of dianhydride to diamine may be 1:1. The molar percentage of the diamine comprising a functional group having active hydrogen may be 5~25% of the total amount of diamine. The temperature under which the polyimide is synthesized is preferably 80~250° C., more preferably 100~200° C. The reaction time may vary depending on the size of the batch. For example, the reaction time for obtaining 10~30 g polyimide is 6~10 hours.

The organosilicon-modified polyimide can be classified as fluorinated aromatic organosilicon-modified polyimides and aliphatic organosilicon-modified polyimides. The fluorinated aromatic organosilicon-modified polyimides are synthesized from siloxane-type diamine, aromatic diamine comprising fluoro (F) group (or referred to as fluorinated aromatic diamine) and aromatic dianhydride comprising fluoro (F) group (or referred to as fluorinated aromatic anhydride). The aliphatic organosilicon-modified polyimides are synthesized from dianhydride, siloxane-type diamine and at least one diamine not comprising aromatic structure (e.g., benzene ring) (or referred to as aliphatic diamine), or from diamine (one of which is siloxane-type diamine) and at least one dianhydride not comprising aromatic structure (e.g., benzene ring) (or referred to as aliphatic anhydride). The aliphatic organosilicon-modified polyimide includes semi-aliphatic organosilicon-modified polyimide and fully aliphatic organosilicon-modified polyimide. The fully aliphatic organosilicon-modified polyimide is synthesized from at least one aliphatic dianhydride, siloxane-type diamine and at least one aliphatic diamine. The raw materials for synthesizing the semi-aliphatic organosilicon-modified polyimide include at least one aliphatic dianhydride or aliphatic diamine. The raw materials required for synthesizing the organosilicon-modified polyimide and the siloxane content in the organosilicon-modified polyimide would have certain effects on transparency, chromism, mechanical property, warpage extent and refractivity of the substrate.

The organosilicon-modified polyimide of the present disclosure has a siloxane content of 20~75 wt %, preferably 30~70 wt %, and a glass transition temperature of below 150° C. The glass transition temperature (Tg) is determined on TMA-60 manufactured by Shimadzu Corporation after adding a thermal curing agent to the organosilicon-modified polyimide. The determination conditions include: load: 5 gram; heating rate: 10° C./min; determination environment: nitrogen atmosphere; nitrogen flow rate: 20 ml/min; temperature range: −40 to 300° C. When the siloxane content is below 20%, the film prepared from the organosilicon-modified polyimide resin composition may become very hard and brittle due to the filling of the phosphor and thermal conductive fillers, and tend to warp after drying and curing, and therefore has a low processability. In addition, its resistance to thermochromism becomes lower. On the other hand, when the siloxane content is above 75%, the film prepared from the organosilicon-modified polyimide resin composition becomes opaque, and has reduced transparency and tensile strength. Here, the siloxane content is the weight ratio of siloxane-type diamine (having a structure shown in formula (A)) to the organosilicon-modified polyimide, wherein the weight of the organosilicon-modified polyimide is the total weight of the diamine and the dianhydride used for synthesizing the organosilicon-modified polyimide subtracted by the weight of water produced during the synthesis.

Formula (A)

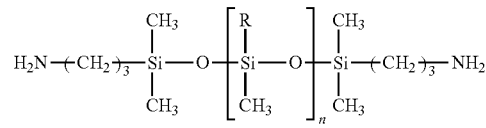

Wherein R is methyl or phenyl, preferably methyl, n is 1~5, preferably 1, 2, 3 or 5.

The only requirements on the organic solvent used for synthesizing the organosilicon-modified polyimide are to dissolve the organosilicon-modified polyimide and to ensure the affinity (wettability) to the phosphor or the fillers to be added. However, excessive residue of the solvent in the product should be avoided. Normally, the number of moles of the solvent is equal to that of water produced by the reaction between diamine and anhydride. For example, 1 mol diamine reacts with 1 mol anhydride to give 1 mol water; then the amount of solvent is 1 mol. In addition, the organic solvent used has a boiling point of above 80° C. and below 300° C., more preferably above 120° C. and below 250° C., under standard atmospheric pressure. Since drying and curing under a lower temperature are needed after coating, if the temperature is lower than 120° C., good coating cannot be achieved due to high drying speed during the coating process. If the boiling point of the organic solvent is higher than 250° C., the drying under a lower temperature may be deferred. Specifically, the organic solvent may be an ether-type organic solvent, an ester-type organic solvent, a dimethyl ether-type organic solvent, a ketone-type organic solvent, an alcohol-type organic solvent, an aromatic hydrocarbon solvent or other solvents. The ether-type organic solvent includes ethylene glycol monomethyl ether, ethylene glycol monoethyl ether, propylene glycol monomethyl ether, propylene glycol monoethyl ether, ethylene glycol dimethyl ether, ethylene glycol diethyl ether, ethylene glycol dibutyl ether, diethylene glycol dimethyl ether, diethylene glycol diethyl ether, diethylene glycol methyl ethyl ether, dipropylene glycol dimethyl ether or diethylene glycol dibutyl ether, and diethylene glycol butyl methyl ether. The ester-type organic solvent includes acetates, including ethylene glycol monoethyl ether acetate, diethylene glycol monobutyl ether acetate, propylene glycol monomethyl ether acetate, propyl acetate, propylene glycol diacetate, butyl acetate, isobutyl acetate, 3-methoxybutyl acetate, 3-methyl-3-methoxybutyl acetate, benzyl acetate and 2-(2-butoxyethoxy)ethyl acetate; and methyl lactate, ethyl lactate, n-butyl acetate, methyl benzoate and ethyl benzoate. The dimethyl ether-type solvent includes triethylene glycol dimethyl ether and tetraethylene glycol dimethyl ether. The ketone-type solvent includes acetylacetone, methyl propyl ketone, methyl butyl ketone, methyl isobutyl ketone, cyclopentanone, and 2-heptanone. The alcohol-type solvent includes butanol, isobutanol, isopentanol, 4-methyl-2-pentanol, 3-methyl-2-butanol, 3-methyl-3-methoxybutanol, and diacetone alcohol. The aromatic hydrocarbon solvent includes toluene and xylene. Other solvents include γ-butyrolactone, N-methylpyrrolidone, N,N-dimethylformamide, N,N-dimethylacetamide and dimethyl sulfoxide.

The present disclosure provides an organosilicon-modified polyimide resin composition comprising the above organosilicon-modified polyimide and a thermal curing agent, which may be epoxy resin, hydrogen isocyanate or bisoxazoline compound. In one embodiment, based on the weight of the organosilicon-modified polyimide, the amount of the thermal curing agent is 5~12% of the weight of the organosilicon-modified polyimide. The organosilicon-modified polyimide resin composition may further comprise heat dispersing particles and phosphor.

Figure 8A:
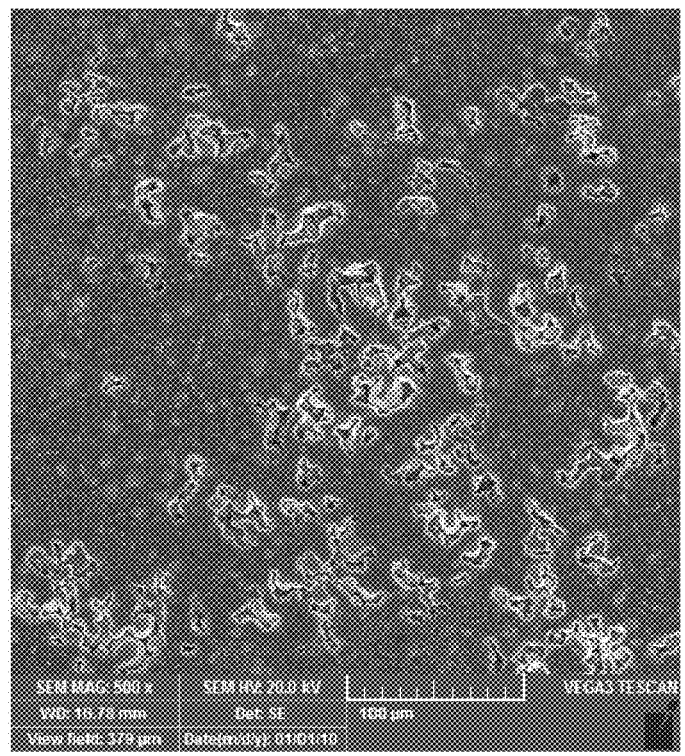
FIG. 8A shows the SEM image of an organosilicon-modified polyimide resin composition composite film (substrate)
Figure 8B:
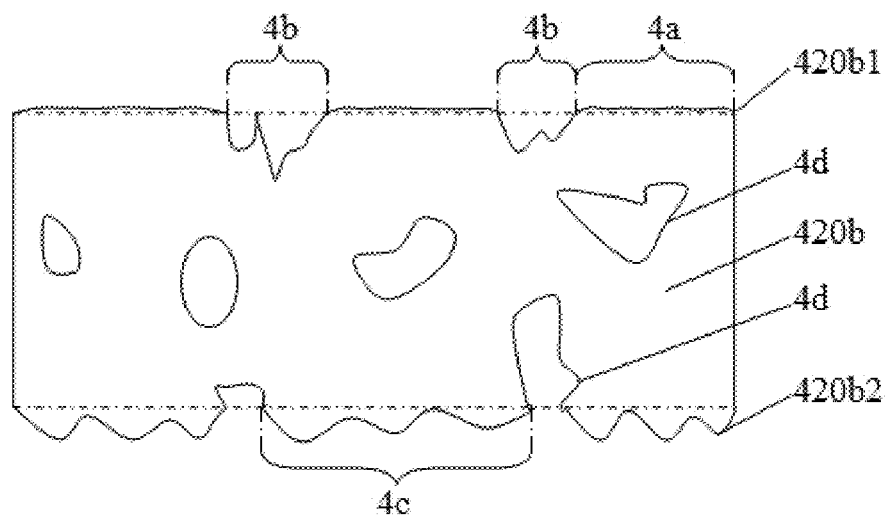
FIG. 8B shows the cross-sectional scheme of an organosilicon-modified polyimide resin composition composite film (substrate) according to an embodiment of the present invention.
Figure 8C:
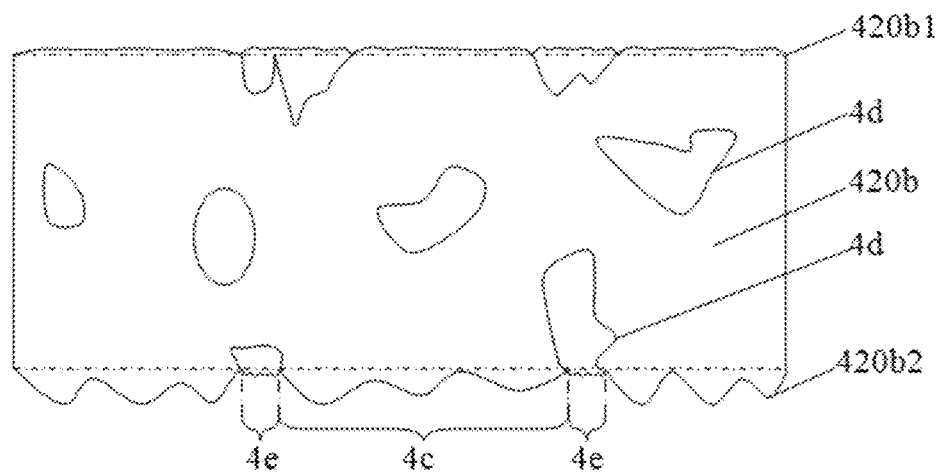
FIG. 8C shows the cross-sectional scheme of an organosilicon-modified polyimide resin composition composite film (substrate) according to another embodiment of the present disclosure.

As shown in FIG. 8B, the organosilicon-modified polyimide resin composition composite film is used as the substrate for the LED soft filament. The substrate 420b has an upper surface 420b1 and an opposite lower surface 420b2. FIG. 8A shows the surface morphology of the substrate after gold is scattered on the surface thereof as observed with vega 3 electron microscope from Tescan Corporation. As can be seen from FIG. 8B and the SEM image of the substrate surface shown in FIG. 8A, there is a cell 4d in the substrate, wherein the cell 4d represents 5~20% by volume, preferably 5~10% by volume, of the substrate 420b, and the cross section of the cell 4d is irregular. FIG. 8B shows the cross-sectional scheme of the substrate 420b, wherein the dotted line is the baseline. The upper surface 420b1 of the substrate comprises a first area 4a and a second area 4b, wherein the second area 4b comprises a cell 4d, and the first area 4a has a surface roughness which is less than that of the second area 4b. The light emitted by the LED chip passes through the cell in the second area and is scattered, so that the light emission is more uniform. The lower surface 420b2 of the substrate comprises a third area 4c, which has a surface roughness which is higher than that of the first area 4a. When the LED chip is positioned in the first area 4a, the smoothness of the first area 4a is favorable for subsequent bonding and wiring. When the LED chip is positioned in the second area 4b or the third area 4c, the area of contact between the die bonding glue and substrate is large, which improves the bonding strength between the die bonding glue and substrate. Therefore, by positioning the LED chip on the upper surface 420b1, bonding and wiring as well as the bonding strength between the die bonding glue and substrate can be ensured at the same time. When the organosilicon-modified polyimide resin composition is used as the substrate of the LED soft filament, the light emitted by the LED chip is scattered by the cell in the substrate, so that the light emission is more uniform, and glare can be further improved at the same time. In an embodiment, the surface of the substrate 420b may be treated with a silicone resin or a titanate coupling agent, preferably a silicone resin comprising methanol or a titanate coupling agent comprising methanol, or a silicone resin comprising isopropanol. The cross section of the treated substrate is shown in FIG. 8C. The upper surface 420b1 of the substrate has relatively uniform surface roughness. The lower surface 420b2 of the substrate comprises a third area 4c and a fourth area 4e, wherein the third area 4c has a surface roughness which is higher than that of the fourth area 4e. The surface roughness of the upper surface 420b1 of the substrate may be equal to that of the fourth area 4e. The surface of the substrate 420b may be treated so that a material with a high reactivity and a high strength can partially enter the cell 4d, so as to improve the strength of the substrate.

When the organosilicon-modified polyimide resin composition is prepared by vacuum defoaming, the vacuum used in the vacuum defoaming may be −0.5~−0.09 MPa, preferably −0.2~−0.09 MPa. When the total weight of the raw materials used in the preparation of the organosilicon-modified polyimide resin composition is less than or equal to 250 g, the revolution speed is 1200~2000 rpm, the rotation speed is 1200~2000 rpm, and time for vacuum defoaming is 3~8 min. This not only maintains certain amount of cells in the film to improve the uniformity of light emission, but also keeps good mechanical properties. The vacuum may be suitably adjusted according to the total weight of the raw materials used in the preparation of the organosilicon-modified polyimide resin composition. Normally, when the total weight is higher, the vacuum may be reduced, while the stirring time and the stirring speed may be suitably increased.

According to the present disclosure, a resin having superior transmittance, chemical resistance, resistance to thermochromism, thermal conductivity, film mechanical property and light resistance as required for a LED soft filament substrate can be obtained. In addition, a resin film having a high thermal conductivity can be formed by simple coating methods such as printing, inkjeting, and dispensing.

When the organosilicon-modified polyimide resin composition composite film is used as the filament substrate (or base layer), the LED chip is a hexahedral luminous body. In the production of the LED filament, at least two sides of the LED chip are coated by a top layer. When the prior art LED filament is lit up, non-uniform color temperatures in the top layer and the base layer would occur, or the base layer would give a granular sense. Accordingly, as a filament substrate, the composite film is required to have superior transparency. In other embodiments, sulfonyl group, non-coplanar structure, meta-substituted diamine, or the like may be introduced into the backbone of the organosilicon-modified polyimide to improve the transparency of the organosilicon-modified polyimide resin composition.

The LED filament structure in the aforementioned embodiments is mainly applicable to the LED light bulb product, so that the LED light bulb can achieve the omnidirectional light illuminating effect through the flexible bending characteristics of the single LED filament. The specific embodiment in which the aforementioned LED filament applied to the LED light bulb is further explained below.

Figure 9A:
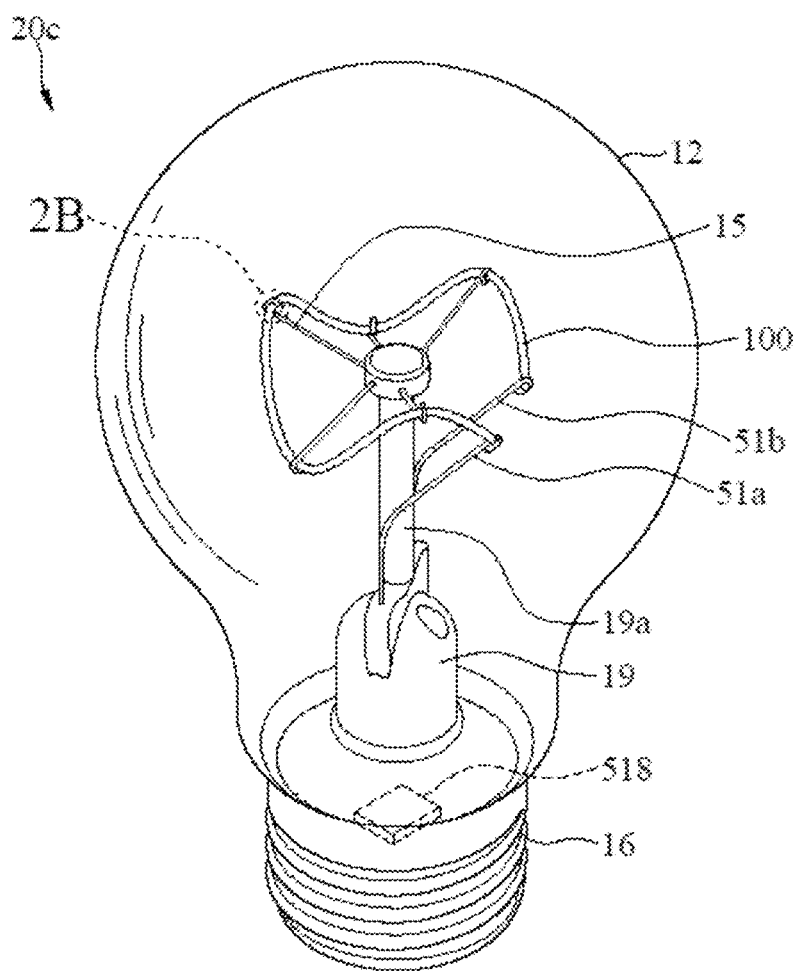
FIG. 9A illustrates a perspective view of an LED light bulb according to the third embodiment of the instant disclosure.

Please refer to FIG. 9A. FIG. 9A illustrates a perspective view of an LED light bulb according to the third embodiment of the present disclosure. According to the third embodiment, the LED light bulb 20c comprises a lamp housing 12, a bulb base 16 connected with the lamp housing 12, two conductive supports 51a, 51b disposed in the lamp housing 12, a driving circuit 518 electrically connected with both the conductive supports 51a, 51b and the bulb base 16, a stem 19, supporting arms 15 and a single LED filament 100.

The lamp housing 12 is a material which is preferably light transmissive or thermally conductive, such as, glass or plastic, but not limited thereto. In implementation, the lamp housing 12 may be doped with a golden yellow material or its surface coated with a yellow film to absorb a portion of the blue light emitted by the LED chip to reduce the color temperature of the light emitted by the LED light bulb 20c. In other embodiments of the present invention, the lamp housing 12 includes a layer of luminescent material (not shown), which may be formed on the inner surface or the outer surface of the lamp housing 12 according to design requirements or process feasibility, or even integrated in the material of the lamp housing 12. The luminescent material layer comprises low reabsorption semiconductor nanocrystals (hereinafter referred to as quantum dots), the quantum dots comprises a core, a protective shell and a light absorbing shell, and the light absorbing shell is disposed between the core and the protective shell. The core emits the emissive light with emission wavelength, and the light absorbing shell emits the excited light with excitation wavelength. The emission wavelength is longer than the excitation wavelength, and the protective shell provides the stability of the light.

The LED filament 100 shown in FIG. 9A is bent to form a contour resembling to a circle while being observed from the top view of FIG. 9A. According to the embodiment of FIG. 9A, the LED filament 100 is bent to form a wave shape from side view. The shape of the LED filament 100 is novel and makes the illumination more uniform. In comparison with a LED bulb having multiple LED filaments, single LED filament 100 has less connecting spots. In implementation, single LED filament 100 has only two connecting spots such that the probability of defect soldering or defect mechanical pressing is decreased.

The stem 19 has a stand 19a extending to the center of the bulb shell 12. The stand 19a supports the supporting arms 15. The first end of each of the supporting arms 15 is connected with the stand 19a while the second end of each of the supporting arms 15 is connected with the LED filament 100.

Figure 9B:
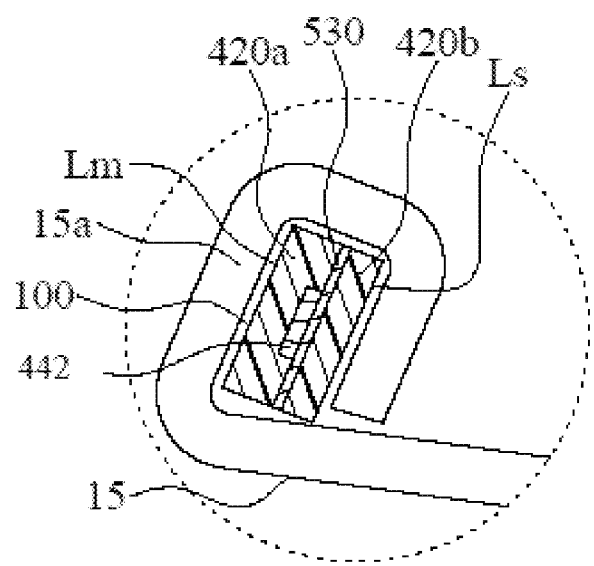
FIG. 9B illustrates an enlarged cross-sectional view of the dashed-line circle of FIG. 9A.

Please refer to FIG. 9B which illustrates an enlarged cross-sectional view of the dashed-line circle of FIG. 9A. The second end of each of the supporting arms 15 has a clamping portion 15a which clamps the body of the LED filament 100. The clamping portion 15a may, but not limited to, clamp at either the wave crest or the wave trough. Alternatively, the clamping portion 15a may clamp at the portion between the wave crest and the wave trough. The shape of the clamping portion 15a may be tightly fitted with the outer shape of the cross-section of the LED filament 100. The dimension of the inner shape (through hole) of the clamping portion 15a may be a little bit smaller than the outer shape of the cross-section of the LED filament 100. During manufacturing process, the LED filament 100 may be passed through the inner shape of the clamping portion 15a to form a tight fit. Alternatively, the clamping portion 15a may be formed by a bending process. Specifically, the LED filament 100 may be placed on the second end of the supporting arm 15 and a clamping tooling is used to bend the second end into the clamping portion to clamp the LED filament 100.

The supporting arms 15 may be, but not limited to, made of carbon steel spring to provide with adequate rigidity and flexibility so that the shock to the LED light bulb caused by external vibrations is absorbed and the LED filament 100 is not easily to be deformed. Since the stand 19a extending to the center of the bulb shell 12 and the supporting arms 15 are connected to a portion of the stand 19a near the top thereof, the position of the LED filaments 100 is at the level close to the center of the bulb shell 12. Accordingly, the illumination characteristics of the LED light bulb 20c are close to that of the traditional light bulb including illumination brightness. The illumination uniformity of LED light bulb 20c is better. In the embodiment, at least a half of the LED filaments 100 is around a center axle of the LED light bulb 20c. The center axle is coaxial with the axle of the stand 19a.

In the embodiment, the first end of the supporting arm 15 is connected with the stand 19a of the stem 19. The clamping portion of the second end of the supporting arm 15 is connected with the outer insulation surface of the LED filaments 100 such that the supporting arms 15 are not used as connections for electrical power transmission. In an embodiment where the stem 19 is made of glass, the stem 19 would not be cracked or exploded because of the thermal expansion of the supporting arms 15 of the LED light bulb 20c. Additionally, there may be no stand in an LED light bulb. The supporting arm 15 may be fixed to the stem or the bulb shell directly to eliminate the negative effect to illumination caused by the stand.

The supporting arm 15 is thus non-conductive to avoid a risk that the glass stem 19 may crack due to the thermal expansion and contraction of the metal filament in the supporting arm 15 under the circumstances that the supporting arm 15 is conductive and generates heat when current passes through the supporting arm 15.

In different embodiments, the second end of the supporting arm 15 may be directly inserted inside the LED filament 100 and become an auxiliary piece in the LED filament 100, which can enhance the mechanical strength of the LED filament 100. Relative embodiments are described later.

The inner shape (the hole shape) of the clamping portion 15a fits the outer shape of the cross section of the LED filament 100; therefore, based upon a proper design, the cross section of the LED filament 100 may be oriented to face towards a predetermined orientation. For example, as shown in FIG. 9B, the LED filament 100 comprises a top layer 420a, LED chips 104, and a base layer 420b. The LED chips 104 are aligned in line along the axial direction (or an elongated direction) of the LED filament 100 and are disposed between the top layer 420a and the base layer 420b. The top layer 420a of the LED filament 100 is oriented to face towards ten o'clock in FIG. 9B. A lighting face of the whole LED filament 100 may be oriented to face towards the same orientation substantially to ensure that the lighting face of the LED filament 100 is visually identical. The LED filament 100 comprises a main lighting face Lm and a subordinate lighting face Ls corresponding to the LED chips. If the LED chips in the LED filament 100 are wire bonded and are aligned in line, a face of the top layer 420a away from the base layer 420b is the main lighting face Lm, and a face of the base layer 420b away from the top layer 420a is the subordinate lighting face Ls. The main lighting face Lm and the subordinate lighting face Ls are opposite to each other. When the LED filament 100 emits light, the main lighting face Lm is the face through which the largest amount of light rays passes, and the subordinate lighting face Ls is the face through which the second largest amount of light rays passes. In the embodiment, there is, but is not limited to, a conductive foil 530 formed between the top layer 420a and the base layer 420b, which is utilized for electrical connection between the LED chips. In the embodiment, the LED filament 100 wriggles with twists and turns while the main lighting face Lm is always towards outside. That is to say, any portion of the main lighting face Lm is towards the bulb shell 12 or the bulb base 16 and is away from the stem 19 at any angle, and the subordinate lighting face Ls is always towards the stem 19 or towards the top of the stem 19 (the subordinate lighting face Ls is always towards inside).

The LED filament 100 shown in FIG. 9A is curved to form a circular shape in a top view while the LED filament is curved to form a wave shape in a side view. The wave shaped structure is not only novel in appearance but also guarantees that the LED filament 100 illuminates evenly. In the meantime, the single LED filament 100, comparing to multiple LED filaments, requires less joint points (e.g., pressing points, fusing points, or welding points) for being connected to the conductive supports 51a, 51b. In practice, the single LED filament 100 (as shown in FIG. 9A) requires only two joint points respectively formed on the two conductive electrodes, which effectively lowers the risk of fault welding and simplifies the process of connection compared to the mechanically connection in the tightly pressing manner.

Figure 9C:
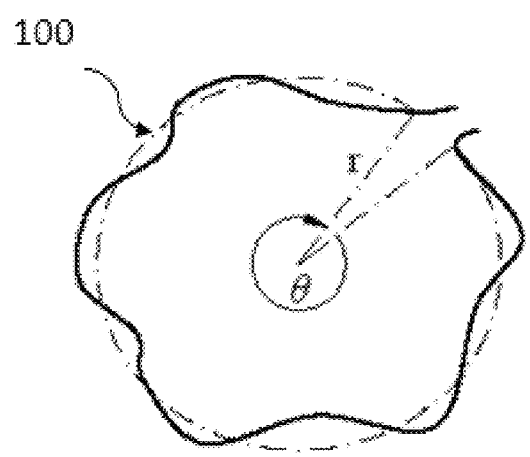
FIG. 9C is a projection of a top view of an LED filament of the LED light bulb of FIG. 9A.

Please refer to FIG. 9C. FIG. 9C is a projection of a top view of an LED filament of the LED light bulb 20c of FIG. 9A. As shown in FIG. 9C, in an embodiment, the LED filament may be curved to form a wave shape resembling a circle observed in a top view to surround the center of the light bulb or the stem. In different embodiments, the LED filament observed in the top view can form a quasi-circle or a quasi U shape.

As shown in FIG. 9B and FIG. 9C, the LED filament 100 surrounds with the wave shape resembling a circle and has a quasi-symmetric structure in the top view, and the lighting face of the LED filament 100 is also symmetric, e.g., the main lighting face Lm in the top view may face outwardly; therefore, the LED filament 100 may generate an effect of an omnidirectional light due to a symmetry characteristic with respect to the quasi-symmetric structure of the LED filament 100 and the arrangement of the lighting face of the LED filament 100 in the top view. Whereby, the LED light bulb 20c as a whole may generate an effect of an omnidirectional light close to a 360 degrees illumination. Additionally, the two joint points may be close to each other such that the conductive supports 51a, 51b are substantially below the LED filament 100. Visually, the conductive supports 51a, 51b keeps a low profile and is integrated with the LED filament 100 to show an elegance curvature.

Figure 10A:
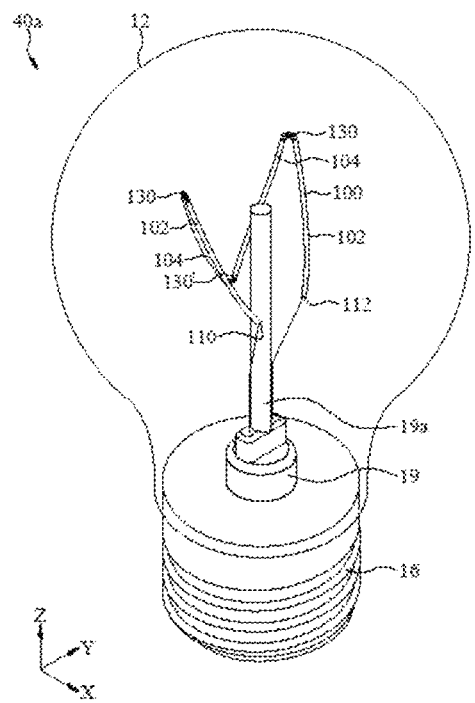
FIGS. 10A to 10D are respectively a perspective view, a side view, another side view and a top view of an LED light bulb in accordance with an embodiment of the present invention.
Figure 10B:
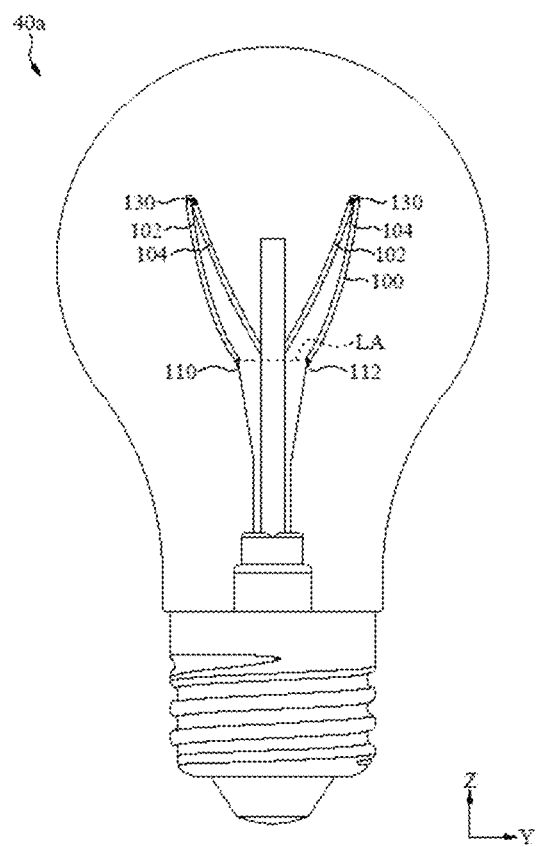
Figure 10C:
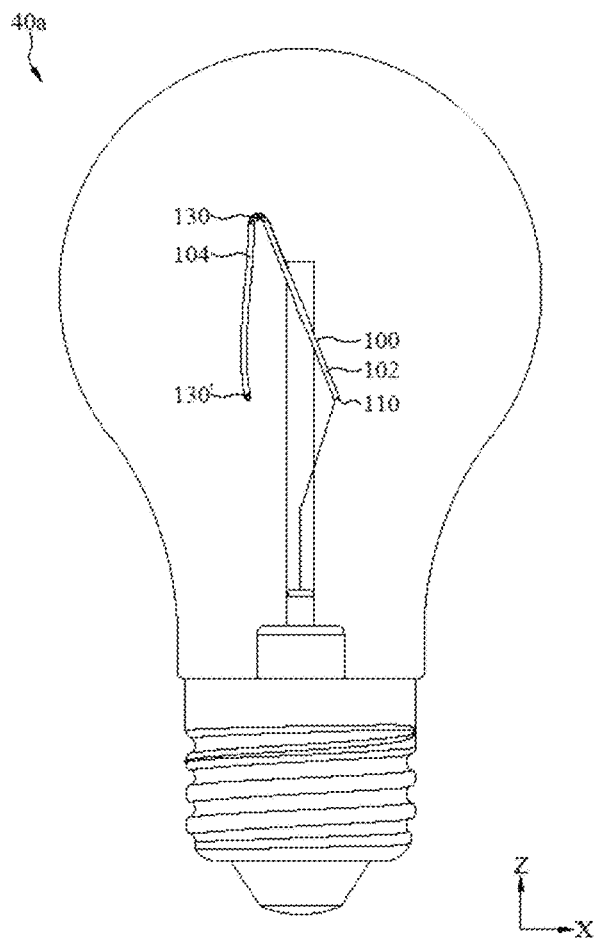
Figure 10D:
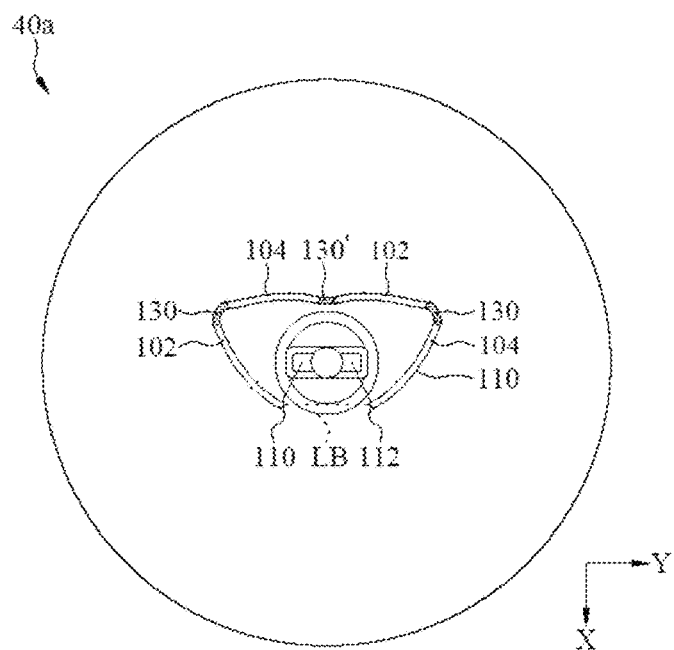

Referring to FIGS. 10A, 10B, 10C and FIG. 10D, FIG. 10A illustrates a schematic diagram of an LED light bulb 40a according to an embodiment of the present invention, FIG. 10B to FIG. 10D are a side view, another side view and the top view of the LED light bulb, respectively. In the present embodiment, the LED light bulb 40a includes a lamp housing 12, a bulb base 16 connected to the lamp housing 12, a stem 19, and a single LED filament 100. Moreover, the LED light bulb 40a and the single LED filament 100 disposed in the LED light bulb 40a can refer to related descriptions of the previous embodiments, wherein the same or similar components and the connection relationship between components is no longer detailed.

In the present embodiment, the stem 19 is connected to the bulb base 16 and located in the lamp housing 12, the stem 19 has a stand 19a extending vertically to the center of the lamp housing 12, the stand 19a is located on the central axis of the bulb base 16, or is located on the central axis of the LED light bulb 40a. The LED filament 100 is disposed around the stand 19a and is located within the lamp housing 12, and the LED filament 100 can be coupled to the stand 19a through a cantilever to maintain a predetermined curve and shape. Wherein a detailed description of the cantilever can be referenced to the previous embodiment and the drawings. The LED filament 100 includes two conductive electrodes 110, 112 at both ends, a plurality of LED sections 102, 104 and a plurality of conductive sections 130. As shown in FIG. 10A to FIG. 10D, in order to separate the conductive section 130 and the LED sections 102, 104 in the drawing, the plurality of the conductive sections 130 of the LED filament 100 is illustrated as points or small segments, which is only for the illustrations. It is easier to understand, and not for any limitation, and the subsequent embodiments are similar to the related drawings by the point or small segment distribution of the conductive section 130 to distinguish from the LED sections 102, 104. As described in various previous embodiments, each of the LED sections 102, 104 can include a plurality of LED chips connected to each other, and each of the conductive sections 130 can include a conductor. Each conductive section 130 is located between adjacent two LED sections 102, 104. The conductors in each conductive section 130 connect the LED chips in the adjacent two LED sections 102, 104, and the LED chips in the two LED sections 102 adjacent to the two conductive electrodes 110, 112 are respectively connected to the two conductive electrodes 110, 112. The stem 19 can be connected to the two conductive electrodes 110, 112 by means of conductive brackets, details of the conductive brackets can be referred to the previous embodiment and the drawings.

As shown in FIG. 10A to FIG. 10D, the LED filament 100 comprises two first conductive sections 130, one second conductive sections 130', and four LED sections 102, 104, and every two adjacent LED sections 102, 104 are connected through the bending first and second conductive section 130, 130'. Moreover, since the first and second conductive sections 130, 130' have better bendability than that of the LED sections 102, 104, the first and second conductive sections 130, 130' between the two adjacent LED sections 102, 104 can be bent severely, so that the angle between the two adjacent LED sections 102, 104 can be smaller, for example, the included angle can reach 45 degrees or less. In the present embodiment, each LED section 102, 104 is slightly curved or not bent compared to the first and second conductive sections 130, 130', so that a single LED filament 100 in the LED light bulb 40a can be bent severer because of the first and second conductive sections 130, 130', and the curling change in bending is more significant. Moreover, the LED filament 100 can be defined as a piece following each bending conductive sections 130, 130', and each LED section 102, 104 is formed into a respective piece.

As shown in FIG. 10B and FIG. 10C, each of the first and second conductive sections 130, 130' and the two adjacent LED sections 102, 104 is composed to form a U-shaped or V-shaped bent structure, that is, the U-shaped or V-shaped bent structure formed by each of the first and second conductive sections 130, 130' and the adjacent two LED sections 102, 104 is bent with two pieces, and the two LED sections 102, 104 are respectively formed the two pieces. In the present embodiment, the LED filament 100 is bent into four pieces by the first and second conductive sections 130, 130', the four LED sections 102, 104 are respectively formed the four pieces. Also, the number of LED sections 102, 104 is one more than the number of the conductive sections 130, 130'.

As shown in FIG. 10B, in the present embodiment, the conductive electrodes 110, 112 are located between the highest point and the lowest point of the LED filament 100 in the Z direction. The highest point is located at the highest first conductive section 130 in the Z direction, and the lowest point is located at the lowest second conductive section 130' in the Z direction. The lower second conductive section 130' and the higher first conductive section 130 are defined with the conductive electrodes 110, 112 as being close to or away from the bulb base 16. Referring to FIG. 10B, in the YZ plane, the positions of the conductive electrodes 110, 112 may constitute a line LA showing with dotted line, there are two first conductive sections 130 above the line LA, and one second conductive sections 130' below the line LA. In other words, in the Z direction, the number of the first conductive sections 130 positioned above the line LA to which the conductive electrodes 110, 112 are connected may be one more than the number of the second conductive section 130' positioned below the line LA. It is also contemplated that relative to the conductive electrodes 110, 112 as a whole, the number of the first conductive sections 130 away from the bulb base 16 is one more than the number of the second conductive section 130' near the bulb base 16. Further, if the LED filament 100 is projected on the YZ plane (refer to FIG. 10B), the line LA connected by the conductive electrodes 110, 112 has at least one intersection with the projection of the LED sections 102, 104. In the YZ plane, the lines LA connected by the conductive electrodes 110, 112 respectively intersect the projections of the two LED sections 104, so that the line LA and the projection of the adjacent two LED sections 104 have two intersections.

As shown in FIG. 10C, if the LED filament 100 is projected on the XZ plane, the projections of the opposing two LED sections 102, 104 overlap each other. In some embodiments, the projections of the opposing two LED sections 102, 104 on a particular plane may be parallel to each other.

As shown in FIG. 10D, if the LED filament 100 is projected on the XY plane, the projections of the conductive electrodes 110, 112 on the XY plane can be connected in a straight line LB showing with dotted line, and the projections of the first and second conductive sections 130,130' on the XY plane are not intersected or overlapped with the line LB, and the projections of the first and second conductive sections 130, 130' on the XY plane are respectively located on one side of the line LB. For example, as showing in FIG. 10D, the projections of the first conductive sections 130 on the XY plane are above the line LB.

As shown in FIGS. 10B to 10D, in the present embodiment, and the projection lengths of the LED filament 100 on the projection planes perpendicular to each other can have a designed proportion, so that the illumination is more uniform. For example, the projection of the LED filament 100 on the first projection surface, such as the XY plane, has a length L1, the projection of the LED filament 100 on the second projection surface, such as the YZ plane, has a length L2, and the projection of the LED filament 100 on the third projection planes, such as the XZ plane, has a length L3. The first projection plane, the second projection plane and the third projection plane are perpendicular to each other, and the normal line of the first projection plane is parallel to the axis of the LED light bulb 40a from the center of the lamp housing 12 to the center of the bulb base 16. Further, the projection of the LED filament 100 on the XY plane as shown in FIG. 10D, and the projection thereof will be similar to an inverted and deformed U shape, and the total length of the projection of the LED filament 100 on the XY plane is the length L1. The projection of the LED filament 100 on the YZ plane as shown in FIG. 10B, the projection thereof will be similar to the inverted and deformed W shape, and the total length of the projection of the LED filament 100 on the YZ plane is the length L2. The projection of the LED filament 100 on the XZ plane can be as shown in FIG. 10C, the projection of which will be similar to an inverted V shape, and the total length of the projection of the LED filament 100 on the XZ plane is the length L3. In the present embodiment, the length L1, the length L2, and the length L3 are approximately in a ratio of 1:1:0.9. In some embodiments, the length L1, the length L2, and the length L3 are approximately in a ratio of 1:(0.5 to 1):(0.6 to 0.9). For example, if the ratio of the length L1, the length L2, and the length L3 is closer to 1:1:1, the illumination uniformity of the single LED filament 100 in the LED light bulb 40a is better, and the omni-directional light appearance is better.

In some embodiments, the projected length of the LED filament 100 in the XZ plane or in the YZ plane is, for example but not limited thereto, a minimum of the height difference between the first conductive section 130 and the second conductive section 130' in the Z direction multiply by the number of LED sections 102, 104, or a minimum of the height difference of the LED filament 100 in the Z direction multiply by the number of LED sections 102, 104. In the present embodiment, the total length of the LED filament 100 is about 7 to 9 times the total length of the first conductive section 130 or the second conductive section 130'.

In the present embodiment, the LED filament 100 can be bent at the positions of the first and second conductive sections 130, 130' to form various curves, so that not only the overall aesthetic appearance of the LED light bulb 40a can be increased but also the light emitting of the LED light bulb 40a can be more uniform, and the better illumination is achieved.

Figure 11A:
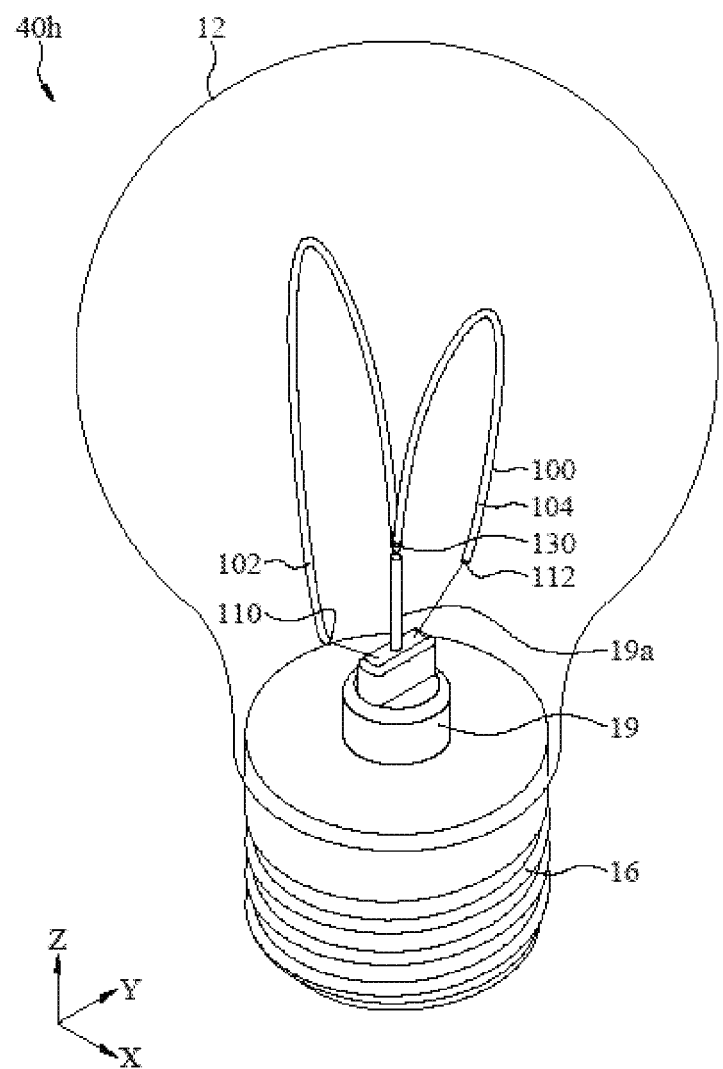
FIGS. 11A to 11D are respectively a perspective view, a side view, another side view and a top view of an LED light bulb in accordance with an embodiment of the present invention.
Figure 11B:
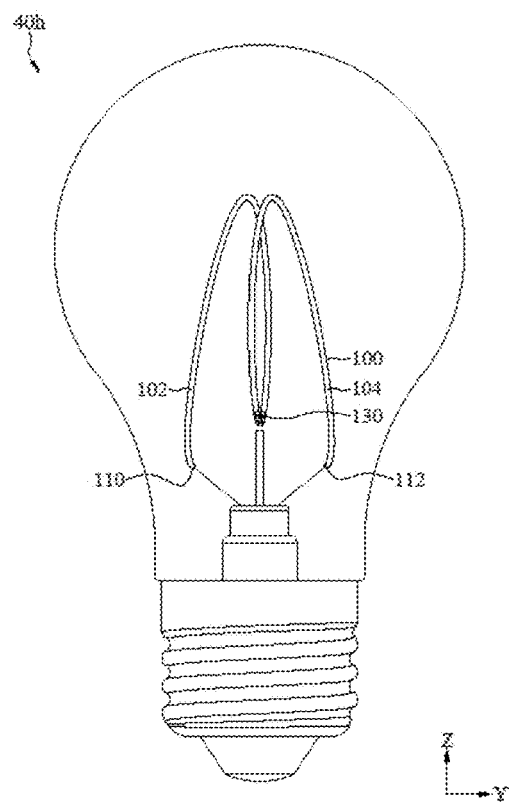
Figure 11C:
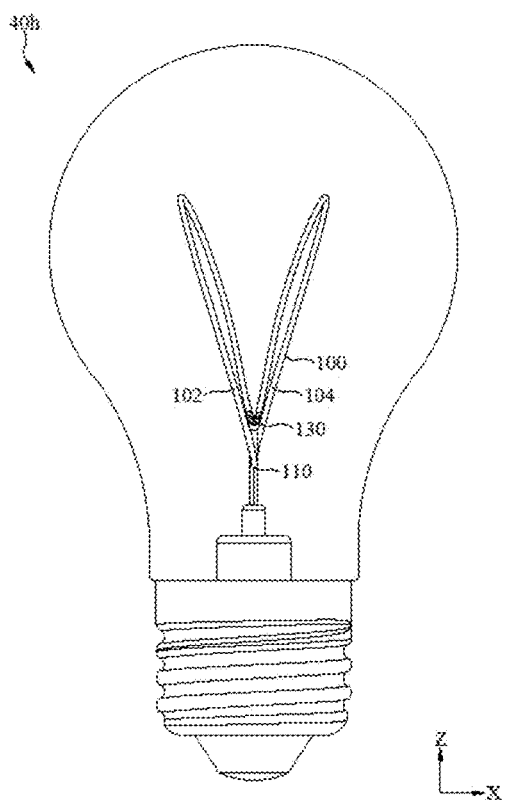
Figure 11D:
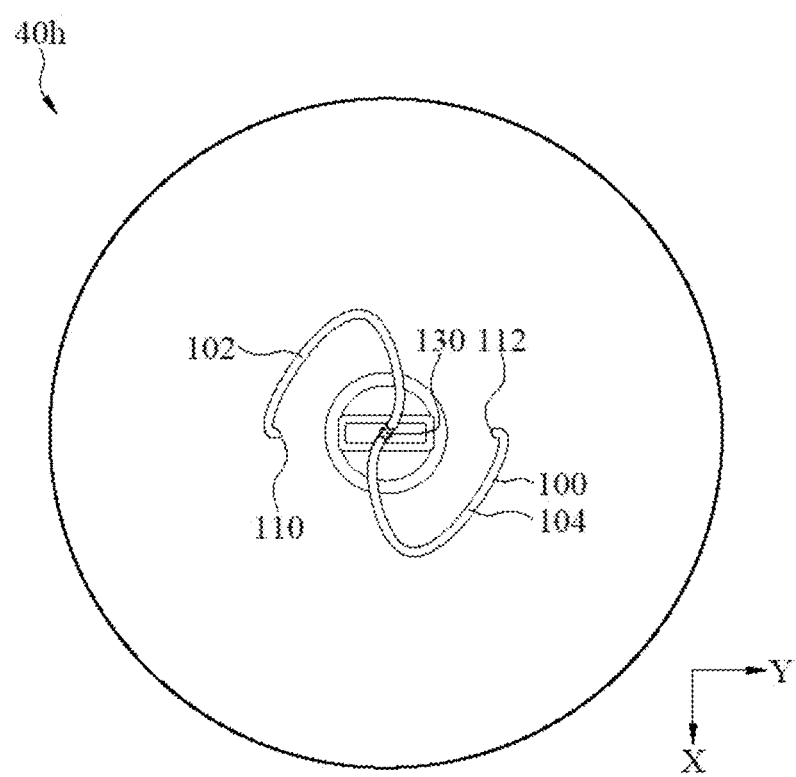

Referring to FIGS. 11A to 11D, FIG. 11A is a perspective diagram of an LED light bulb 40h according to an embodiment of the present invention, and FIGS. 11B to 11D are respectively side view, another side view, and top view of the FIG. 11A. In the present embodiment, the LED light bulb 40h includes a lamp housing 12, a bulb base 16 connected to the lamp housing 12, a stem 19, a stand 19a, and a single LED filament 100. The LED filament 100 includes two conductive electrodes 110, 112 at two ends, a plurality of LED sections 102, 104 and a single conductive section 130.

Moreover, the LED light bulb 40h and the single LED filament 100 disposed in the LED light bulb 40h can refer to related descriptions of the previous embodiments, wherein the same or similar components and the connection relationship between components is no longer detailed.

Referring to FIGS. 11A to 11D, in the present invention, the LED filament section 100 includes one conductive section 130, two LED sections 102, 104, and between two adjacent LED sections 102, 104 is connected by the conductive section 130. Wherein the LED filament 100 having a circular arc at the highest point of the bending curvature, that is, each of the LED sections 102, 104 respectively having a circular arc at the highest point of the LED filament 100, and the conductive section also exhibits a circular arc at the low point of the LED filament. Moreover, the LED filament 100 can be defined as having a plurality of sections, each of the sections is connected between the first and second conductive sections 130, and each LED section 102, 104 is formed into a respective section.

Moreover, since the LED filament 100 is equipped with a flexible base layer, the flexible base layer preferably is made by an organosilicon-modified polyimide resin composition, and thus the LED sections 102, 104 themselves also have a certain degree of bendability. In the present embodiment, the two LED sections 102, 104 are respectively bent to form in the shape like an inverted deformed U letter, and the conductive section 130 is located between the two LED sections 102, 104, and the degree of the bending of the conductive section 130 is the same as or greater than the degree of the bending of the LED sections 102, 104. In other words, the two LED sections 102, 104 of the LED filament are respectively bent at the high point to form in the shape like an inverted deformed U letter and have a bending radius value at R1, and the conductive section 130 is bent at a low point of the LED filament 100 and has a bending radius value at R2, wherein the value R1 is the same as or greater than the value R2. Through the configuration of the conductive section 130, the LED filament 100 disposing in a limited space can be realized with a small radius bending of the LED filament 100. In one embodiment, the bending points of the LED sections 102, 104 are at the same height in the Z direction. Further, in the Z direction, the stand 19a of the present embodiment has a lower position than the stand 19a of the previous embodiment, and the height of the present stand 19a is corresponding to the height of the conductive section 130. For example, the lowest portion of the conductive section 130 can be connected to the top of the stand 19a so that the overall shape of the LED filament 100 is not easily deformed. In various embodiments, the conductive sections 130 may be connected to the stand 19a through the perforation of the top of the stand 19a, or the conductive sections 130 may be glued to the top of the stand 19a to connect with each other, but are not limited thereto. In an embodiment, the conductive section 130 and the stand 19a may be connected by a guide wire, for example, a guide wire connected to the conductive section 130 is drawn at the top of the stand 19a.

As shown in FIG. 11B, in the present embodiment, the height of the conductive section 130 is higher than the two conductive electrodes 110, 112 in the Z direction, and the two LED sections 102, 104 are respectively shaped upward from the two conductive electrodes 110, 112 to the highest point and then are bent down to connect with the conductive section 130. As shown in FIG. 11C, in the present embodiment, the contour of the LED filament 100 in the XZ plane is similar to the V letter, that is, the two LED sections 102, 104 are respectively shaped obliquely upward and outward and are bent respectively at the highest point and then obliquely inwardly to connect with the conductive section 130. As shown in FIG. 11D, in the present embodiment, the LED filament 100 has a contour in the shape like S letter in the XY plane. As shown in FIG. 11B and FIG. 11D, in the present embodiment, the conductive section 130 is located between the conductive electrodes 110, 112. As shown in FIG. 11D, in the XY plane, the main bending points of the LED sections 102, 104, and the conductive electrodes 110, 112 are substantially on the circumference centered on the conductive section 130.

Figure 12:
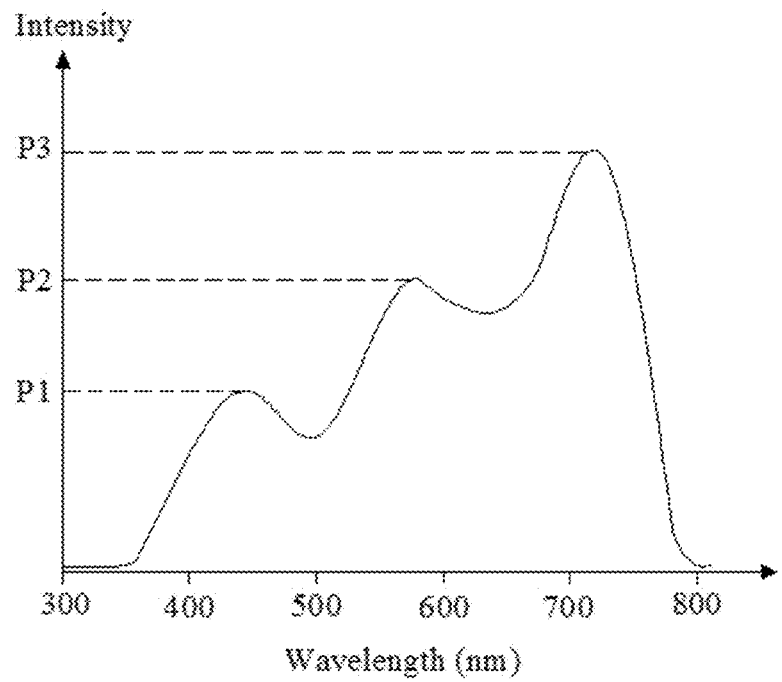
FIG. 12 is a schematic view showing the light emission spectrum of an LED light bulb in accordance with an embodiment of the present invention.
Figure 13:
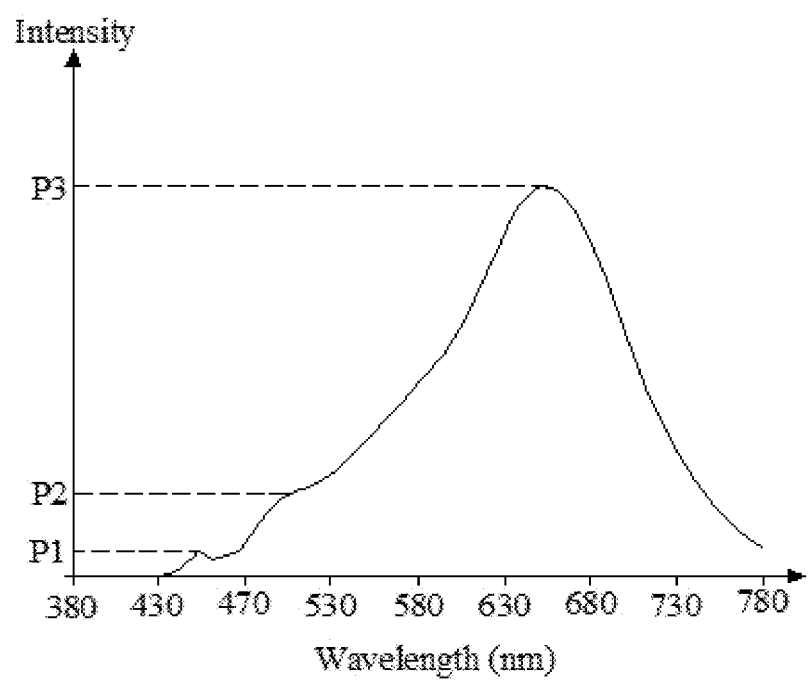
FIG. 13 is a schematic view showing the light emission spectrum of an LED light bulb in accordance with another embodiment of the present invention.

Referring to FIG. 12, which is a schematic diagram of the light emission spectrum of an LED light bulb according to an embodiment of the present invention. In the present embodiment, the LED light bulb may be any of the LED light bulbs disclosed in the previous embodiments, and any one of the LED light bulbs disclosed in the previous embodiments is provided. The light emitted by the LED light bulb is measured by a spectrometer to obtain a spectrum diagram as shown in FIG. 12. From the spectrum diagram, the spectral distribution of the LED light bulb is mainly between the wavelength range of about 400 nm to 800 nm. Moreover, there are three peaks of intensity values P1, P2, P3 in wavelength ranges corresponding to the light emitted by the LED light bulb. The wavelength of the intensity value P1 is between about 430 nm and 480 nm, the wavelength of the intensity value P2 is between about 580 nm and 620 nm, and the wavelength of the intensity value P3 is between about 680 nm and 750 nm. The light intensity of the peak P1 is less than that of the peak P2, and the light intensity of the peak P2 is less than the light intensity of the peak P3. As shown in FIG. 12, such a spectral distribution is close to the spectral distribution of a conventional incandescent filament lamp and also close to the spectral distribution of natural light. In accordance with an embodiment of the present invention, a schematic diagram of the light emission spectrum of a single LED filament is shown in FIG. 13. From the spectrum diagram, it can be seen that the spectral distribution of the LED light bulb is mainly between the wavelength range of about 400 nm to 800 nm, and there are three peaks of intensity values P1, P2, P3 in that wavelength range. The wavelength of the intensity value P1 is between about 430 nm and 480 nm, the wavelength of the intensity value P2 is between about 480 nm and 530 nm, and the wavelength of the intensity value peak P3 is between about 630 nm and 680 nm. Such a spectral distribution is close to the spectral distribution of a conventional incandescent filament lamp and also close to the spectral distribution of natural light.

The meaning of the term "a single LED filament" and "a single strip LED filament" as used in the present invention is mainly composed of the aforementioned conductive section, the LED section, the connection between thereof, the light conversion layer (including the consecutive top layer or the bottom layer, with continuous formation to cover or support all the components), and two conductive electrodes electrically connected to the conductive brackets of the LED light bulb disposing at both ends of the LED filament, which is the single LED filament structure referred to in the present invention.

The various embodiments of the present invention described above may be arbitrarily combined and transformed without being mutually exclusive, and are not limited to a specific embodiment. For example, some features as described in the embodiment shown in FIG. C although not described in the embodiment shown in FIG. A, those features may be included in the embodiment of FIG. A. That is, those skilled in the art can applies some features of the FIG.

A to the embodiment shown in the FIG. C without additional creativity. Or alternatively, although the invention has illustrated various creation schemes by taking the LED light bulb as an example, it is obvious that these designs can be applied to other shapes or types of light bulb without additional creativity, such as LED candle bulbs, and the like.

The invention has been described above in terms of the embodiments, and it should be understood by those skilled in the art that the present invention is not intended to limit the scope of the invention. It should be noted that variations and permutations equivalent to those of the embodiments are intended to be within the scope of the present invention. Therefore, the scope of the invention is defined by the scope of the appended claims.

What is claimed is:

1. An LED filament, comprising:
a plurality of LED sections, wherein each of the plurality of LED sections comprises a plurality of LED filament units, each of the plurality of LED filament units includes a LED chip with an upper surface and a lower surface opposite to the upper surface of the LED chip, and
a light conversion layer comprising a top layer and a base layer, and the base layer comprises an upper surface and a lower surface opposite to the upper surface of the base layer, where the top layer with an upper surface and a lower surface opposite to the upper surface of the top layer is disposed on at least two sides of each of the LED chips, the lower surface of the LED chips is close to the upper surface of the base layer, and the upper surface of the top layer is away from the LED chips;
wherein H represents a distance from the upper surface of each of the LED chips to the upper surface of the top layer, and H is between a and $10C/2 \tan 0.5\alpha$, wherein a represents a maximum of both values, $0.5C/2 \tan 0.5\alpha$ and $W1/2 \tan 0.5\beta$, C represents an average length of each of the LED filament units within one of the LED sections in a longitudinal direction of the LED filament, a represents an illumination angle of each of the LED chips in the longitudinal direction of the LED filament, W1 represents a width of the upper surface of the base layer in a short axial direction of the LED filament; and β represents an illumination angle of each of the LED chips in the short axial direction of the LED filament;
wherein a phosphor particle concentration of the top layer is greater than a phosphor particle concentration of the base layer.

2. The LED filament of claim 1, wherein H is between A and $2C/2 \tan 0.5\alpha$; A represents a maximum of both values, $C/2 \tan 0.5\alpha$ and $W1/2 \tan 0.5\beta$.

3. The LED filament of claim 1, wherein H is between b and 2.9 C, b represents a maximum of 0.14C and 0.28W1.

4. The LED filament of claim 1, wherein H is between B and 0.58C, B represents a maximum of 0.28C and 0.28W1.

5. The LED filament of claim 1, wherein adjacent two LED filament units are connected by a wire, and a portion of the wire is exposed by the top layer.

6. A LED light bulb, comprising:
the LED filament according to claim 1;
a lamp housing with a central axis;
a bulb base connected to the lamp housing;
two conductive supports disposed in the lamp housing; and
a driving circuit disposed in the bulb base and electrically connected to the two conductive supports; wherein
the LED filament is flexible and disposed in the lamp housing and electrically connected to the two conductive supports.

7. The LED light bulb of claim 6, wherein the LED filament of claim 1 further comprises:
a first LED section comprising a first plurality of the LED filament units connected in series, wherein the first LED section is bent in the lamp housing;
a second LED section comprising a second plurality of the LED filament units connected in series, wherein the second LED section is bent in the lamp housing;
a conductive section disposed between the first LED section and the second LED section, wherein the conductive section is electrically connected to one of two ends of the first LED section and one of two ends of the second LED section; and the conductive section comprises a conductor electrically connecting to one of the LED chips of the first plurality of the LED filament units and one of the LED chips of the second plurality of the LED filament units; wherein
a first conductive electrode disposed at the other end of the first LED sections, wherein the first conductive electrode is electrically connected to one of the LED chips of the first plurality of the LED filament units and one of the two conductive supports; and
a second conductive electrode disposed at the other end of the second LED sections, wherein and the second conductive electrode is electrically connected to one of the LED chips of the second plurality of the LED filament units and one of the two conductive supports.

8. The LED light bulb of claim 7, wherein in the first LED section, each of the LED chips of the first plurality of the LED filament units is connected in series by wires; in the second LED section, each of the LED chips of the second plurality of the LED filament units is connected in series by wires; the conductor is a conductive foil; and the conductor is electrically connected to one of the LED chip of the first plurality of the LED filament units of the first LED section by a wire.

9. The LED light bulb of claim 7, wherein a portion of the conductor is disposed between the top layer and the base layer.

10. The LED light bulb of claim 7, wherein the first conductive electrode and the second conductive electrode are disposed between the top layer and the base layer.

11. The LED light bulb of claim 7, wherein a portion of the conductor is exposed from the light conversion layers.

* * * * *